(12) United States Patent
Niimura

(10) Patent No.: US 9,431,290 B2
(45) Date of Patent: *Aug. 30, 2016

(54) SEMICONDUCTOR DEVICE AND MANUFACTURING METHOD THEREFOR

(71) Applicant: FUJI ELECTRIC CO., LTD., Kawasaki-shi (JP)

(72) Inventor: Yasushi Niimura, Matsumoto (JP)

(73) Assignee: FUJI ELECTRIC CO., LTD., Kawasaki-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 14/731,027

(22) Filed: Jun. 4, 2015

(65) Prior Publication Data

US 2015/0270157 A1 Sep. 24, 2015

Related U.S. Application Data

(63) Continuation of application No. 14/246,249, filed on Apr. 7, 2014, now Pat. No. 9,076,725.

(30) Foreign Application Priority Data

| Apr. 8, 2013 | (JP) | 2013-080337 |
| Apr. 19, 2013 | (JP) | 2013-088295 |
| Feb. 21, 2014 | (JP) | 2014-031306 |

(51) Int. Cl.

| *H01L 21/26* | (2006.01) |
| *H01L 21/42* | (2006.01) |
| *H01L 21/765* | (2006.01) |
| *H01L 21/263* | (2006.01) |
| *H01L 21/28* | (2006.01) |
| *H01L 21/265* | (2006.01) |
| *H01L 29/06* | (2006.01) |
| *H01L 21/66* | (2006.01) |

(52) U.S. Cl.
CPC ........... *H01L 21/765* (2013.01); *H01L 21/263* (2013.01); *H01L 21/265* (2013.01); *H01L 21/2636* (2013.01); *H01L 21/28* (2013.01); *H01L 29/0638* (2013.01); *H01L 22/14* (2013.01)

(58) Field of Classification Search
CPC .......... H01L 21/02351; H01L 21/02354; H01L 21/02129; H01L 21/02576; H01L 21/02579; H01L 21/28079; H01L 27/1104; H01L 29/435; H01L 29/6659; H01L 29/66325; H01L 29/7393; H01L 51/0508
USPC .............. 438/195, 308, 461, 465, 535, 780; 257/E21.006, E21.007, E21.126, 257/E21.127, E21.134, E21.267, E21.328, 257/E21.329, E21.333, E21.347
See application file for complete search history.

(56) References Cited

U.S. PATENT DOCUMENTS

| 6,091,249 | A | 7/2000 | Talbot et al. |
| 6,475,432 | B2 | 11/2002 | Balmer |
| 6,677,000 | B2 | 1/2004 | Neuhaus-Steinmetz et al. |
| 7,977,632 | B2 | 7/2011 | Todokoro et al. |
| 8,525,127 | B2 | 9/2013 | Noji et al. |
| 9,076,725 | B2 * | 7/2015 | Niimura ................ H01L 21/263 |

FOREIGN PATENT DOCUMENTS

JP 2004273863 A 9/2004

OTHER PUBLICATIONS

Notice of Allowance issued in U.S. Appl. No. 14/246,249, mailed Mar. 5, 2015.

* cited by examiner

*Primary Examiner* — David Nhu
(74) *Attorney, Agent, or Firm* — Rossi, Kimms & McDowell LLP

(57) ABSTRACT

A semiconductor device manufacturing method is disclosed by which electron beam irradiation is accomplished at a low cost while exhibiting uniform characteristics. A wafer stack consisting of multiple stacked wafers is irradiated with an electron beam from both the front surface and reverse surface. As such, a semiconductor device manufacturing method is provided whereby the electrical characteristics are extremely uniform between wafers, and costs are reduced by reducing the number of electron beam irradiations.

28 Claims, 26 Drawing Sheets

SEMICONDUCTOR DEVICE AND MANUFACTURING METHOD THEREFOR

This application is a continuation of Ser. No. 14/246,249 filed Apr. 7, 2014, U.S. Pat. No. 9,076,725 B2, and claims priority to JP2013-080337, filed Apr. 8, 2013, JP2013-088295, filed Apr. 19, 2013 and JP2014-031306 filed Feb. 21, 2014.

BACKGROUND OF THE INVENTION

A. Field of the Invention

The present invention relates to a semiconductor device manufacturing method having a step of irradiating a semiconductor substrate with an electron beam, and to a semiconductor device manufactured by the method.

B. Description of the Related Art

In general, bipolar semiconductor devices, in which the minority carrier is the conductive carrier, include p-i-n diodes, insulating gate bipolar transistors (IGBTs) and the like. Bipolar power semiconductor devices have a wide range of voltage ratings, from about 600 V to 6500 V.

On the other hand, the majority carrier is the conductive carrier in unipolar power semiconductor devices, of which power MOSFETs (MOSFET: insulted-gate field effect transistors) are the leading example. A power MOSFET is operated by the majority carrier (electrons) during forward conduction. During reverse bias, however, a parasitic diode operates between the p-type base layer and the n-drift layer and n-drain layer. That is, the minority carrier (holes) is injected from the p-type base layer into the n-drift layer, with reverse conduction characteristics. Thus, the operations of the power MOSFET are bipolar during reverse conduction. The voltage rating of a power MOSFET is roughly tens of volts to 1000 V.

In the case of a bipolar power semiconductor device, low voltage depression is achieved because a carrier (electrons, holes) with an exponentially higher concentration than the drift layer accumulates in the drift layer during conduction. When the conduction state changes to a blocking state, or during switching in other words, all of this accumulated carrier needs to be swept away in order to deplete the drift layer. This means that switching takes some time. Thus, the key to achieving both low loss characteristics and high-speed switching characteristics in a bipolar power semiconductor device is to find a way of swiftly sweeping away the accumulated carrier while maintaining low voltage depression.

One way to achieve rapid switching of a bipolar power semiconductor device is by electron beam irradiation. Irradiating a power semiconductor device with an electron beam serves to introduce crystal defects broadly (deeply) into the drift layer in particular of the semiconductor substrate, forming recombination centers. The switching time can be reduced as a result. A common method of electron beam irradiation is to irradiate a monocrystalline wafer with an electron beam with an acceleration energy of approximately 2 MeV to 5 MeV. The crystal defect concentration is controlled by adjusting the irradiation dose of the electron beam. Accelerated switching can then be achieved by annealing the wafer for a set period of time at 200° C. to 500° C. to form recombination centers.

Japanese Patent Application Publication No. 2004-273863 describes a method whereby the acceleration energy is increased to 10 MeV to simultaneously irradiate multiple silicon wafers with an electron beam and thereby reduce costs by reducing the number of irradiations.

U.S. Pat. No. 6,475,432 describes a wafer stack structure for irradiating multiple wafers with an electron beam, and a stack manufacturing method. U.S. Pat. No. 6,475,432 does not describe a method for irradiating the wafer stack with an electron beam In general, an irradiation dose of about 10 kGy can be used per irradiation in electron beam irradiation. If the necessary irradiation dose for achieving the desired high-speed switching characteristics is 100 kGy, 10 irradiations are required, and variation per irradiation increases with the number of irradiations. The reason for fixing the irradiation dose and adjusting the number of irradiations as necessary has to do with the fact that precise dose adjustment for each product generally increases costs and decreases throughput on a commercial basis. Thus, when irradiation is repeated 10 times or so it produces about 20% variation in the irradiation dose. This variation in the irradiation dose causes variability of the element characteristics because it leads to variation in the crystal defect concentration of the semiconductor substrate.

As described in Japanese Patent Application Publication No. 2004-273863, for example, when multiple wafers are irradiated in one irradiation operation, the differences and variation in the irradiation dose tend to increase because the thickness from the closest wafer to the furthest wafer from the irradiation source amounts to several mm.

The high-speed switching characteristics are positively correlated with the irradiation dose of the electron beam. Thus, the switching time can be reduced and the high-speed switching characteristics improved by increasing the number of electron beam irradiations. However, because there is more variation in the irradiation dose as discussed above, the characteristics are less uniform due to variation in the crystal defects. There is urgent demand for reductions and management of variability for automotive applications in particular, and a need for ways to achieve both lower-cost electron beam irradiation and more uniform characteristics.

The present invention is directed to overcoming or at least reducing the effects of one or more of the problems set forth above.

SUMMARY OF THE INVENTION

The present invention resolves the problems described above and provides a semiconductor device manufacturing method by which electron beam irradiation can be accomplished at a lower cost while exhibiting uniform characteristics.

The present invention is a method of manufacturing a semiconductor device implementing electron beam irradiation from principal surfaces of a wafer stack formed of two or more stacked semiconductor substrates. The method comprises: a first irradiation step of implementing electron beam irradiation from one principal surface of the wafer stack; and a second irradiation step of implementing electron beam irradiation with the same acceleration energy as in the previous irradiation from the other principal surface of the wafer stack.

The irradiation dose in the second irradiation step may be the same as the irradiation dose in the first irradiation step.

The number of irradiations in the first irradiation step may be the same as the number of irradiations in the second irradiation step.

The irradiation dose in the second irradiation step may be different from the irradiation dose in the first irradiation step.

The irradiation dose in either one of the first and second irradiation steps may be at least 1% to less than 100% of the irradiation dose in the other one of the first and second irradiation steps.

A pair of steps comprising the first irradiation step and the second irradiation step may be repeated multiple times.

Adjacent semiconductor substrates in the wafer stack may be stacked such that the first principal surfaces face each other or such that the second principal surfaces face each other.

The combined thickness of the semiconductor substrates in the wafer stack may be thinner than the range of the electron beam relative to the semiconductor substrates.

The combined thickness of the semiconductor substrates in the wafer stack may be thinner than half the range of the electron beam relative to the semiconductor substrates.

The acceleration energy in the first irradiation step may be such that the concentration distribution of crystal defects introduced into the two or more semiconductor substrates by the first irradiation step increases from the one principal surface of the wafer stack to the other principal surface of the wafer stack.

A method may be implemented which includes: a data acquisition step in which an irradiation dose monitor is first exposed to an electron beam and dose data on irradiation from the one principal surface to the other principal surface of the wafer stack is obtained with respect to the multiple semiconductors; and a calculation step in which the necessary irradiation dose of the electron beam and number of irradiations at the same acceleration energy as that used in exposing the irradiation dose monitor is calculated from the irradiation dose data acquired in the data acquisition step, wherein the irradiation step and second irradiation step are performed in accordance with the acquired necessary irradiation dose and number of irradiations.

Defining as x an irradiation dose of the semiconductor substrate, of the semiconductor substrates in the wafer stack, that is closest to the source of the electron beam in the data acquisition step, and defining as y an irradiation dose of the semiconductor substrate, of the semiconductor substrates in the wafer stack, that is furthest from the electron beam source producing the electron beam, and moreover defining as D the minimum necessary irradiation dose of the semiconductor substrates in the calculation step, the combined number of electron beam irradiations in the first irradiation step and second irradiation step may be 2D/(x+y).

A step of heat treatment following electron beam irradiation of heat processing may also be included after the second irradiation step.

Hydrogen may also be included in the atmosphere for the step of heat treatment following electron beam irradiation.

A step of forming a surface electrode may also be included before the step of heat treatment following electron beam irradiation.

A step of forming a surface electrode may also be included after the step of heat treatment following electron beam irradiation.

A barrier metal may also be contained in the surface electrode.

A semiconductor device is obtained by manufacture based on this manufacturing method.

A method of manufacturing a semiconductor device at low cost and with uniform characteristics is achieved in the present invention.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Figure 1:
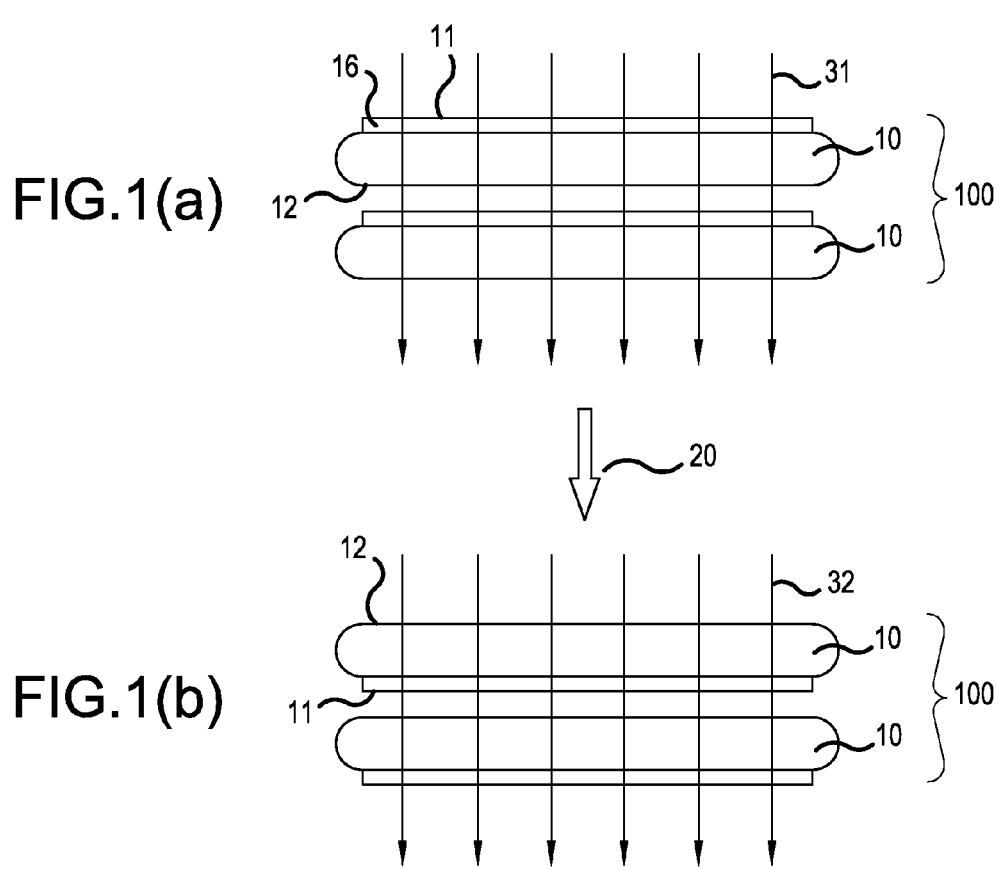
FIGS. 1(a) and 1(b) show a main component manufacturing-process diagram of the semiconductor device manufacturing method of the first embodiment of the invention.

Embodiments of the invention are explained below. In the following explanations, the amount of irradiance (dose or the like) directed at an object (semiconductor wafer or the like) from an electron beam irradiation device is called the electron beam dose. The dose received by the object irradiated with the electron beam is called the irradiation dose. This irradiation dose is determined according to electron beam dose and the composition (electron or molecular composition) of the irradiation object.

First Embodiment

The semiconductor device manufacturing method of the first embodiment of the invention is explained here. FIGS. 1(a) and 1(b) are a process diagram showing the sequence of steps in the semiconductor device manufacturing method of one embodiment of the invention.

For example, two semiconductor wafers 10, each having surface part 16 with the multiple MOS gates, source electrodes and the like of vertical MOSFETs formed on surface 11, are stacked one on top of the other with a polymer separator in between, and placed in a specialized polymer case. The surface structures of the MOSFETs formed on surface 11 are not explained here because the structure is extremely detailed relative to the diameter of semiconductor wafer 10. The semiconductor wafer is of silicon, SiC, GaN or the like. Silicon was used in this first embodiment. Wafer stack 100 of semiconductor wafers 10 is formed in this way. The thickness of each semiconductor wafer 10 is roughly 200 to 1000 μm, for example. The second semiconductor wafer 10 is stacked with its front surface 11 facing the reverse surface 12 of the first semiconductor wafer 10.

Next, first electron beam irradiation 31 is performed from the front side of semiconductor wafer 10 in wafer stack 100. The acceleration energy of the first electron beam irradiation 31 is about 5 MeV, for example. The electron beam dose per irradiation is 20 kGy, and the wafers are irradiated 10 times. The steps up to this point constitute the first electron beam irradiation step as shown by FIG. 1(a).

Next, the polymer case is turned upside-down (case inversion 20), and second electron beam irradiation 32 is performed from the reverse surface 12 of a semiconductor wafer 10 in wafer stack 100. The acceleration energy of the irradiation is 5 MeV as in the previous step. The electron beam dose per irradiation is 20 kGy, and the wafers are irradiated 10 times. Thus, the total electron beam dose is the same as in the previous step. This constitutes the second electron beam irradiation step as shown in FIG. 1(b).

Semiconductor wafers 10 are then removed from the wafer stack, and the removed semiconductor wafers 10 are heat treated. This heat treatment serves to repair defects near the MOSFET channels. The temperature for heat treatment is about 320° C. to 380° C., for example.

After the heat treatment step, electrodes are formed on the reverse surfaces of semiconductor wafers 10, and the wafer manufacturing process is completed.

Next, the steps before and after electron beam irradiation are explained. FIGS. 10 to 17 are cross-sectional views illustrating the semiconductor device manufacturing method in more detail. In the first embodiment, the semiconductor device is explained as a MOSFET, and more particularly a super-junction MOSFET. The surface structure consists of two regions: an active region that channels the switching current (principal current) from the front surface to the reverse surface of the semiconductor substrate, and a field relaxation region (or in other words a junction edge termination region) that surrounds the active region and reduces the field strength, which increases on the active region outer periphery surfaces due to expansion of the depletion layer when the device is off. Both a source electrode for feeding the principal current and a gate electrode for sending signals to the MOS gate are provided in the active layer. In FIGS. 10 to 17 and the explanations below, a cross-section of semiconductor wafer 10 represents any one semiconductor wafer in the wafer stack explained above. Silicon is given as an example of the semiconductor, but the same can be achieved with compound semiconductors as represented by silicon carbide (SiC), gallium nitride (GaN) and gallium arsenide (GaAs).

Figure 10:
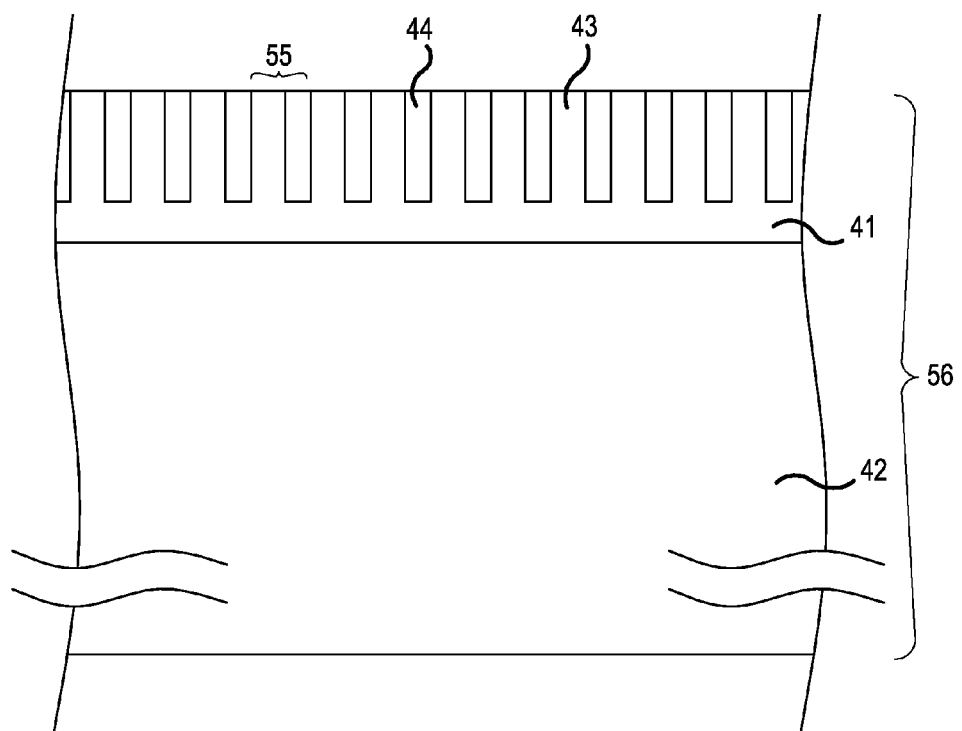
FIG. 10 is a main component cross sectional view showing a manufacturing-process of the MOSFET manufacturing method of the first embodiment of the invention.

Substrate 56 of the semiconductor device is formed first as shown in FIG. 10. A CZ (Czochralski) silicon wafer (n-type highly-doped substrate) doped with a sufficiently high concentration of an n-type impurity (dopant) such as antimony or arsenic to achieve oversaturation is used as n-type drain layer 42. N-type drift layer 41 with a lower impurity concentration than n-type drain layer 42 is grown epitaxially with a specific impurity concentration and thickness on one surface (front surface) of n-type drain layer 42. The dopant in this case is phosphorus, for example. Next, after an n-type layer has been grown epitaxially with a specific thickness, a p-type dopant (such as boron) is introduced selectively into specific locations by ion implantation, for example. The steps from epitaxial growth of the n-type layer to ion implantation of the p-type dopant are repeated several times, after which the structure is activated by heat treatment. In this way, parallel p-n structure 55 combining an n-type layer and a p-type layer, or in other words a super-junction drift structure comprising p-type second columns 44 formed parallel to n-type first columns 43, is formed on the surface of n-type drift layer 41. The impurity concentration of n-type first columns 43 may be higher than the impurity concentration of n-type drift layer 41. The thickness of n-type drift layer 41 may be 0 μm (no drift layer) to about 30 μm. The thickness of n-type first columns 43 and p-type second columns 44 may be 20 μm to 60 μm.

Figure 11:
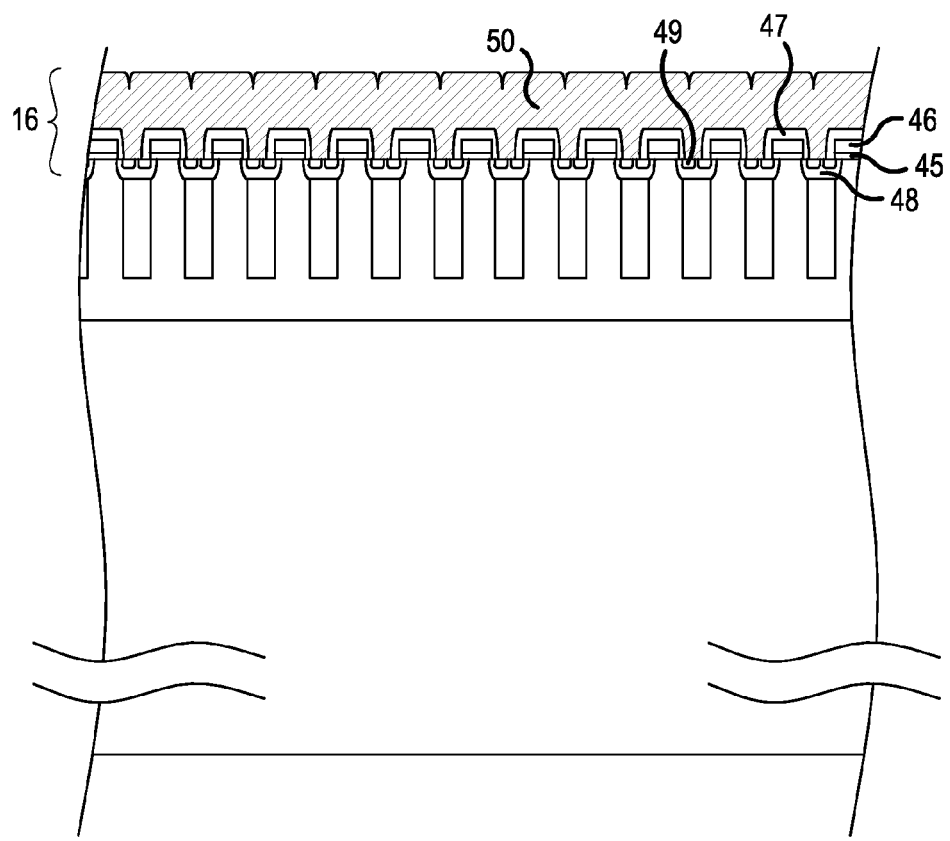
FIG. 11 is a main component cross sectional view showing a manufacturing-process of the MOSFET manufacturing method of the first embodiment of the invention.

Next, a guard ring or other junction termination region (not shown) is formed around the active region. Gate insulating films 45 and gate electrodes 46 are then formed selectively on the surfaces of n-type first columns 43 and p-type second columns 44 in the active region as shown in FIG. 11. P-type base layers 48 and n-type source layers 49 are formed by ion implantation and heat treatment so as to self-align with these gate insulating films 45 and gate electrodes 46. Next, interlayer insulating films 47 are formed as known PSG films, BPSG films or the like so as to cover gate electrodes 46, and interlayer insulating films 47 are selectively etched to expose the surfaces of p-type base layers 48 and n-type source layers 49 and form openings.

MOS gate structures (surface structures) are formed in the active region by the steps up to this point.

Figure 12:
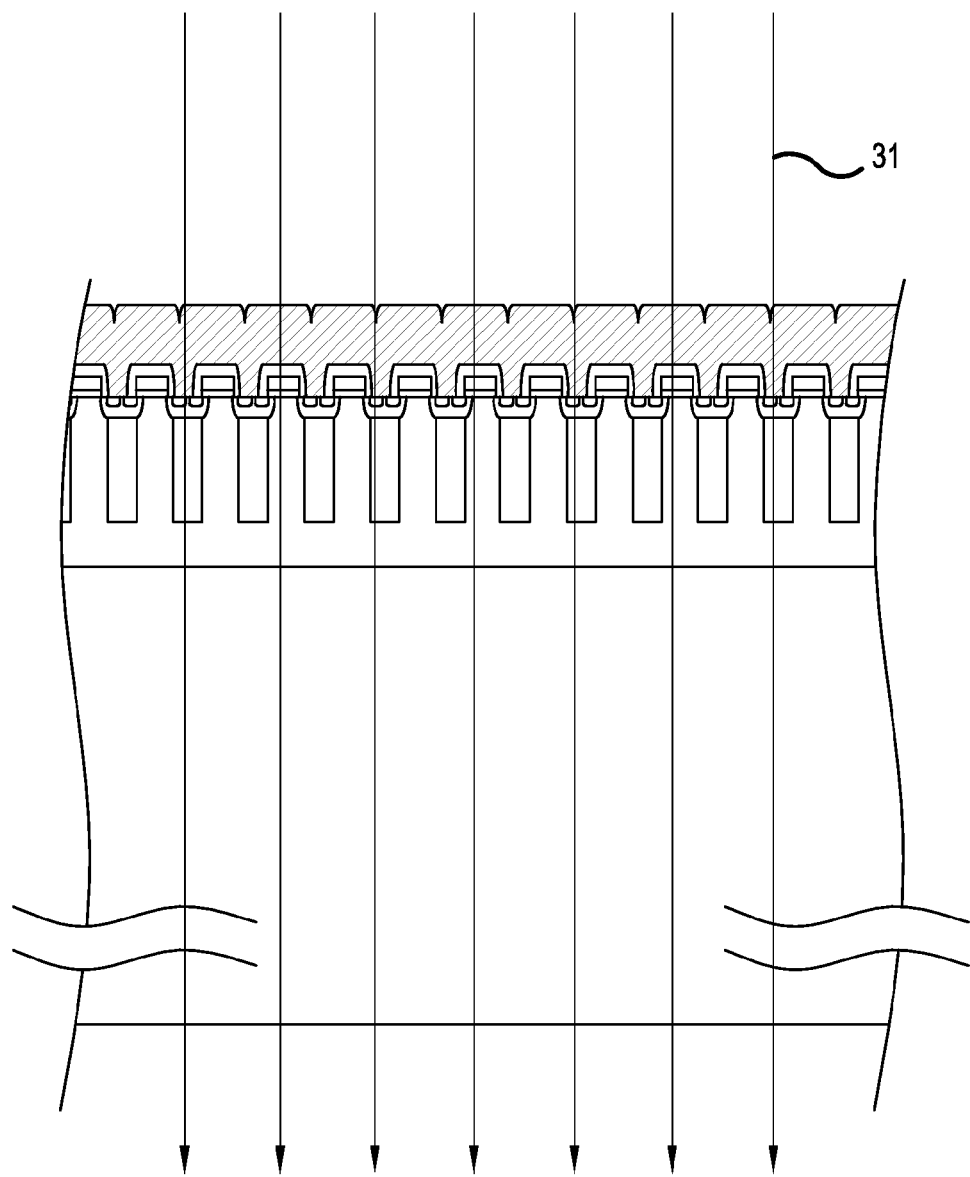
FIG. 12 is a main component cross sectional view showing a manufacturing-process of the MOSFET manufacturing method of the first embodiment of the invention.

The interlayer insulating films are annealed, source electrode 50 is formed from an aluminum-silicon alloy film or the like, and sintering is performed by heat treatment. At this stage, a barrier metal having titanium (Ti), tungsten (W), cobalt (Co) or the like as a constituent metal element may be formed before the aluminum-silicon alloy film or the like is formed. A surface electrode (source electrode 50) is formed in this way, completing the basic MOSFET structure. In terms of heat history, the temperature is 900° or more, for example, up to the annealing of interlayer insulating film 47, while the source electrode is sintered at about 200 to 500° C., for example. A known surface protective film (passivation film) film may also be formed as a polyimide film or the like after sintering. Next, as shown in FIG. 12, first electron beam irradiation 31 is performed at a specific dose from the front side of the wafer, for example. The direction of the electron beams is shown with arrows.

Figure 13:
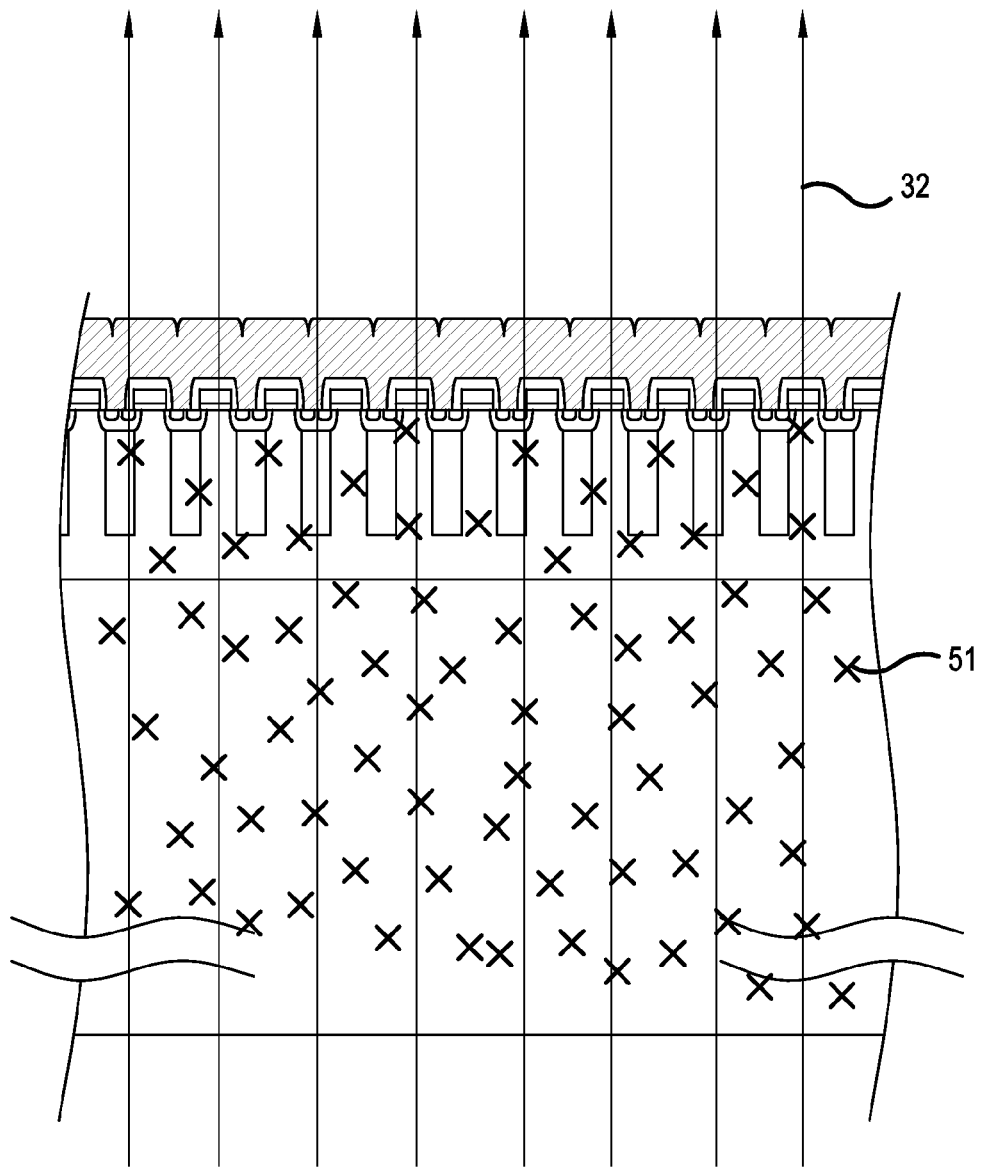
FIG. 13 is a main component cross sectional view showing a manufacturing-process of the MOSFET manufacturing method of the first embodiment of the invention.

Next, as shown in FIG. 13, the wafer case is inverted as explained with reference to FIG. 1, and the wafers with lattice defects 51 (principally point defects) formed by first electron beam irradiation 31 are subjected to second electron beam irradiation 32 at the same dose as first electron beam irradiation 31. The "x" marks in FIG. 13 symbolize lattice defects 51, but do not indicate the exact locations or distribution of lattice defects 51. In second electron beam irradiation 32, the irradiation direction of the electron beams from the source towards the wafer case is the same as in first electron beam irradiation 31. In second electron beam irradiation 32, the electron beam irradiation is performed from another principal surface (the reverse surface in FIG. 13) of the wafers because the wafer case has been inverted. That is, in FIG. 13 the inversion 20 of the case in FIG. 1 is represented by reversing the direction of the arrows used to indicate the second electron beam irradiation from the direction of the arrows used to indicate first electron beam irradiation 31.

Figure 14:
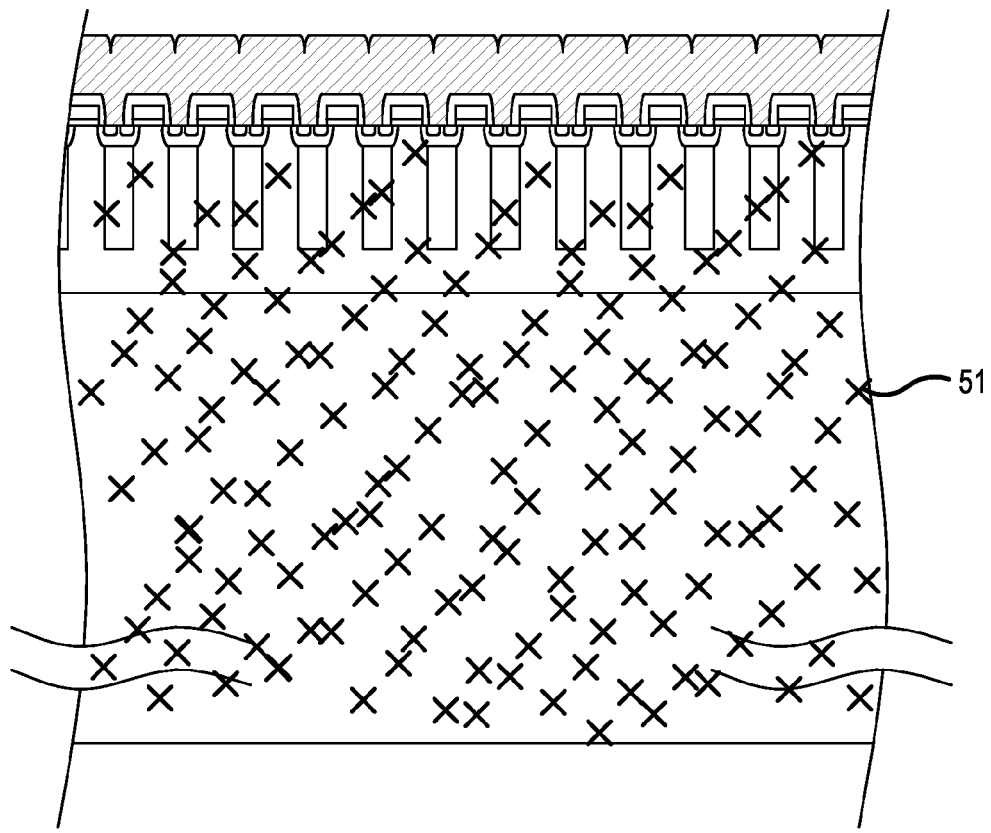
FIG. 14 is a main component cross sectional view showing a manufacturing-process of the MOSFET manufacturing method of the first embodiment of the invention.

Next, as shown in FIG. 14, all of the irradiated wafers in which lattice defects 51 have been increased by performing second electron beam irradiation 32 in addition to first electron beam irradiation 31 are heat treated (heat treatment following electron beam irradiation). The object of the heat treatment following electron beam irradiation is to reduce the defect density of lattice defects 51 introduced by first electron beam irradiation 31 and second electron beam irradiation 32 to a specific value, and thereby achieve a desired value for the reverse recovery time of the body diodes (also called the parasitic diodes or reverse conduction diodes) contained in the MOSFET. A body diode is a diode composed of p-type base layer 48, p-type second column 44, n-type first column 43, n-type drift layer 41 and n-type drain layer 42 of the MOSFET. Moreover, if electron beam irradiation is performed without heat treatment the density of lattice defects 51 is too great, the concentration of the carrier that accumulates in parallel p-n structures 55 and n-type drift layers 41 during reverse conduction is reduced, and the value of the forward voltage drop of the body diodes is higher than the desired value. Thus, heat treatment following electron beam irradiation also has the effect of reducing the density of lattice defects 51 and reducing the value of the forward voltage drop to the desired value. Another object is defect recovery near p-type base layers 48 where the MOSFET channels (electron inversion layers formed at the boundaries with gate insulating films of the p-type base layers 48) are formed. This serves to control fluctuations in the gate threshold value caused by electron beam irradiation.

Figure 15:
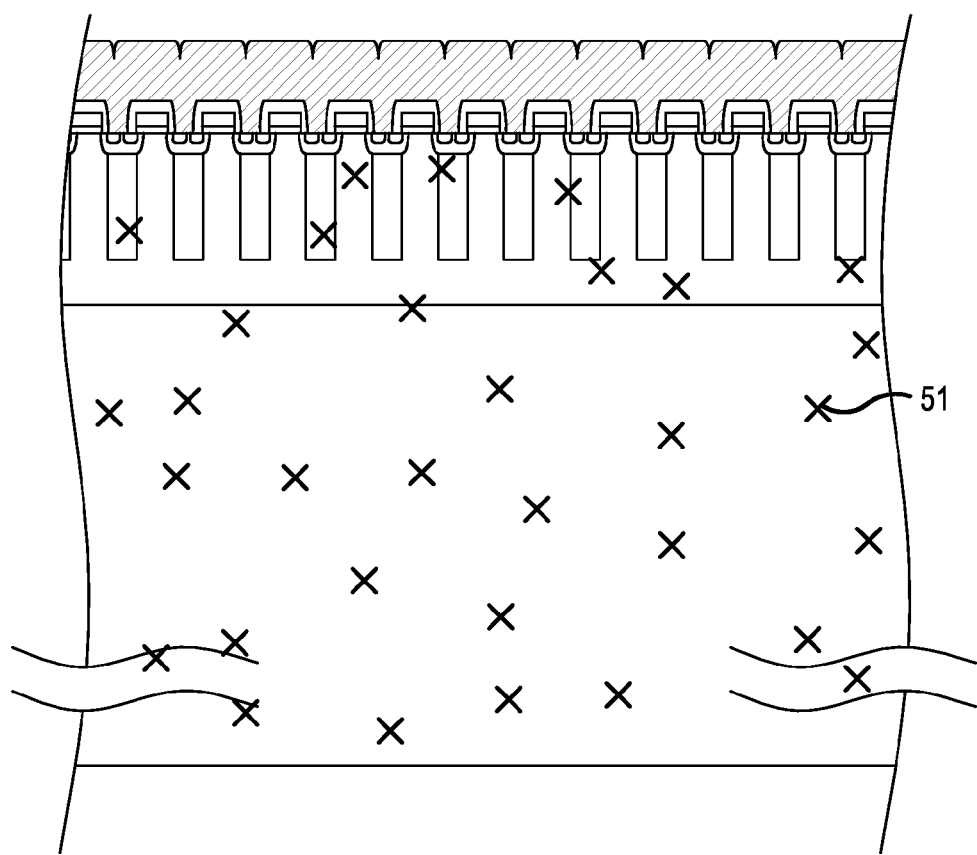
FIG. 15 is a main component cross sectional view showing a manufacturing-process of the MOSFET manufacturing method of the first embodiment of the invention.

FIG. 15 shows how the defect density of lattice defects 51 is reduced by the heat treatment following electron beam irradiation. This heat treatment following electron beam irradiation is performed in an electric furnace with a holding temperature (uniform temperature distribution), for example. The density of lattice defects 51 in all wafers exposed to the electron beam is thus reduced uniformly while maintaining the uniform density distribution produced by two-sided irradiation with the electron beam, resulting in roughly the same desirable lattice defect density in all wafers.

Figure 16:
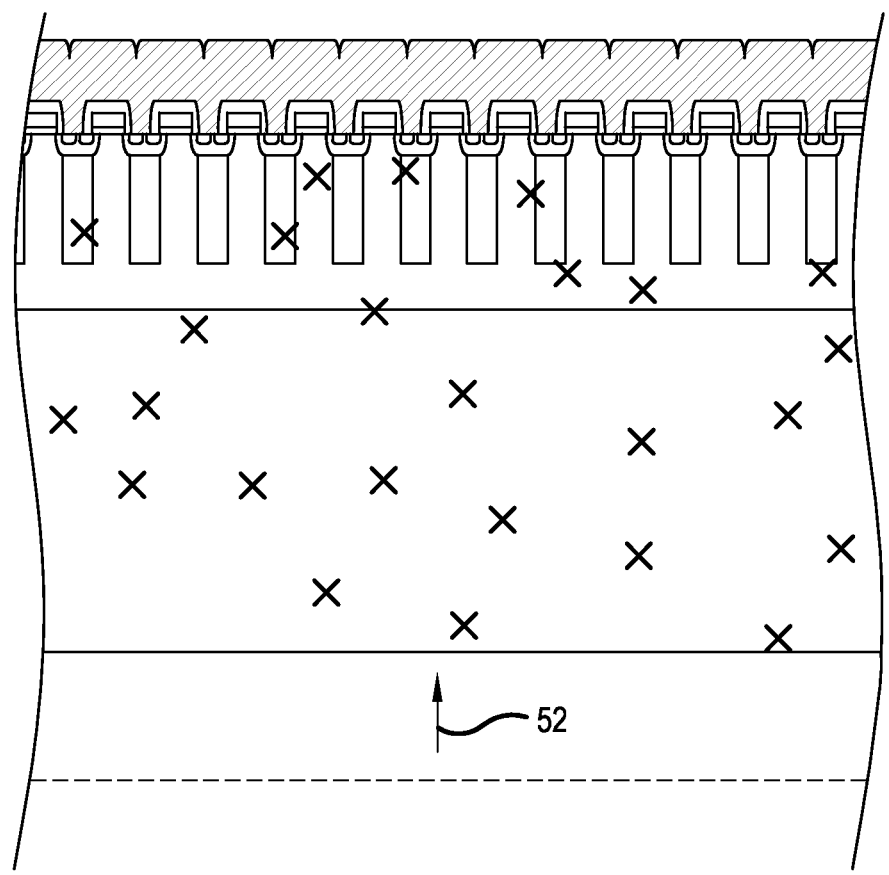
FIG. 16 is a main component cross sectional view showing a manufacturing-process of the MOSFET manufacturing method of the first embodiment of the invention.

Next, as shown in FIG. 16, the wafer thickness is reduced by performing grinding 52 on n-type drain layer 42 (the n-type high-density substrate) on the reverse side of the wafers. Because the semiconductor device of the application is generally mounted with solder on a metallic frame, one object of this thinning is to alleviate the stress caused by differences in the thermal expansion coefficients of the semiconductor device and metallic frame. It also has the effect of reducing the resistance during MOSFET conduction (on-state resistance) by reducing the thickness in the direction of current conduction. In addition, thinning also has the effect of reducing the thermal capacity of the MOSFET, making it easier for heat generated during operation to escape from both surfaces of the substrate, and reducing the operating temperature of the MOSFET.

Figure 17:
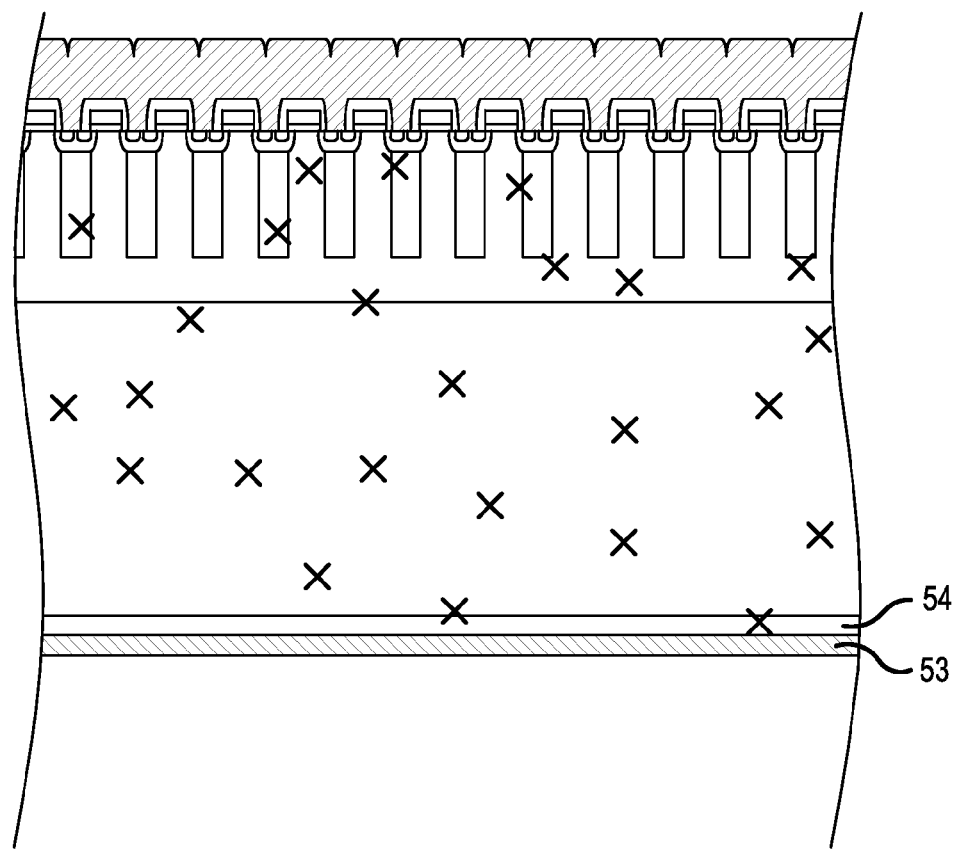
FIG. 17 is a main component cross sectional view showing a manufacturing-process of the MOSFET manufacturing method of the first embodiment of the invention.

Finally, as shown in FIG. 17, high-concentration n-type contact layer 54 is formed on the reverse surface of the wafer, and drain electrode 53 is formed. For n-type contact layer 54, if phosphorus, for example, is ion implanted into the reverse surface and the implantation surface is then laser annealed, a low-resistance ohmic contact can be formed without the thermal effects of melting of the surface electrode and shape deformation of the p-type base layer, parallel p-n structure and other p-n junctions. N-type contact layer 54 may be omitted when arsenic is used as a dopant in an n-type high-concentration substrate. This is because the saturating concentration of arsenic is an order of magnitude greater than that of antimony, so that an ohmic contact with drain electrode 53 can be formed without forming n-type contact layer 54. Super-junction MOSFET 60 is thus completed having a uniform defect density distribution produced by two-sided irradiation with an electron beam.

Figure 18:
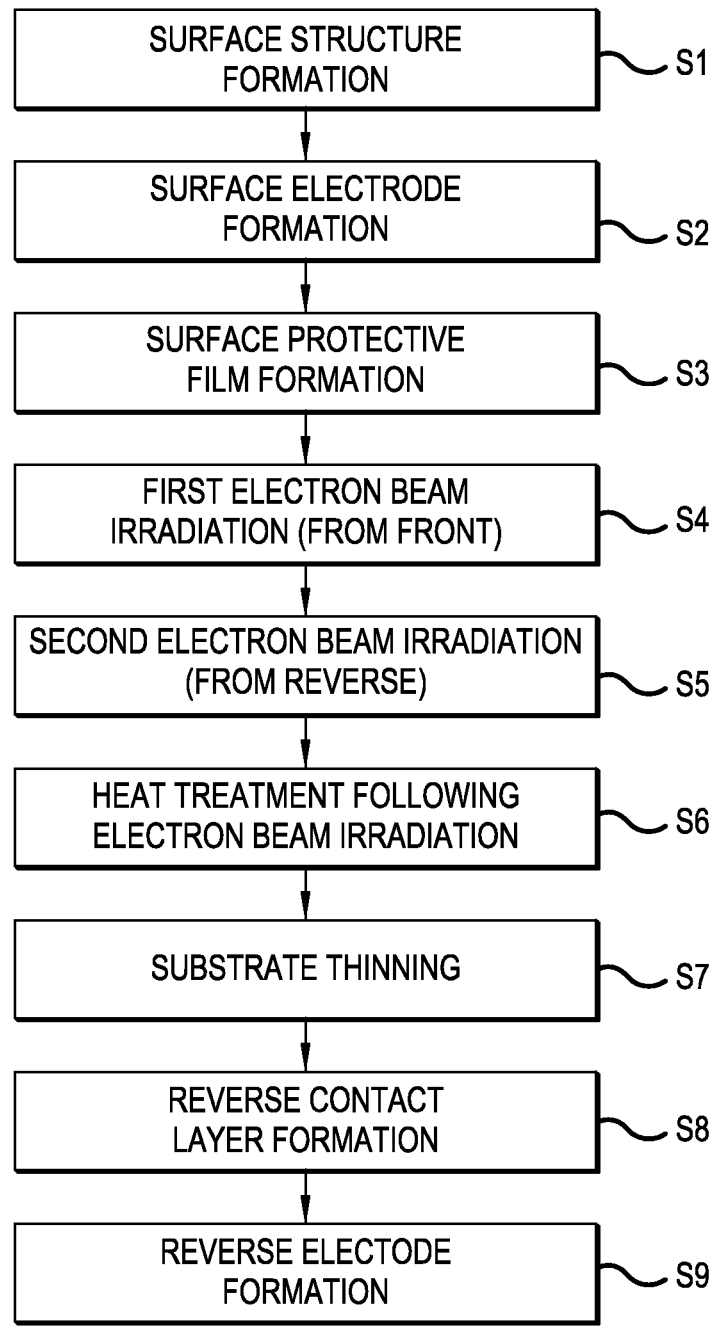
FIG. 18 is a manufacturing process flow chart showing a semiconductor device manufacturing method of to the first embodiment of the invention.
Figure 19:
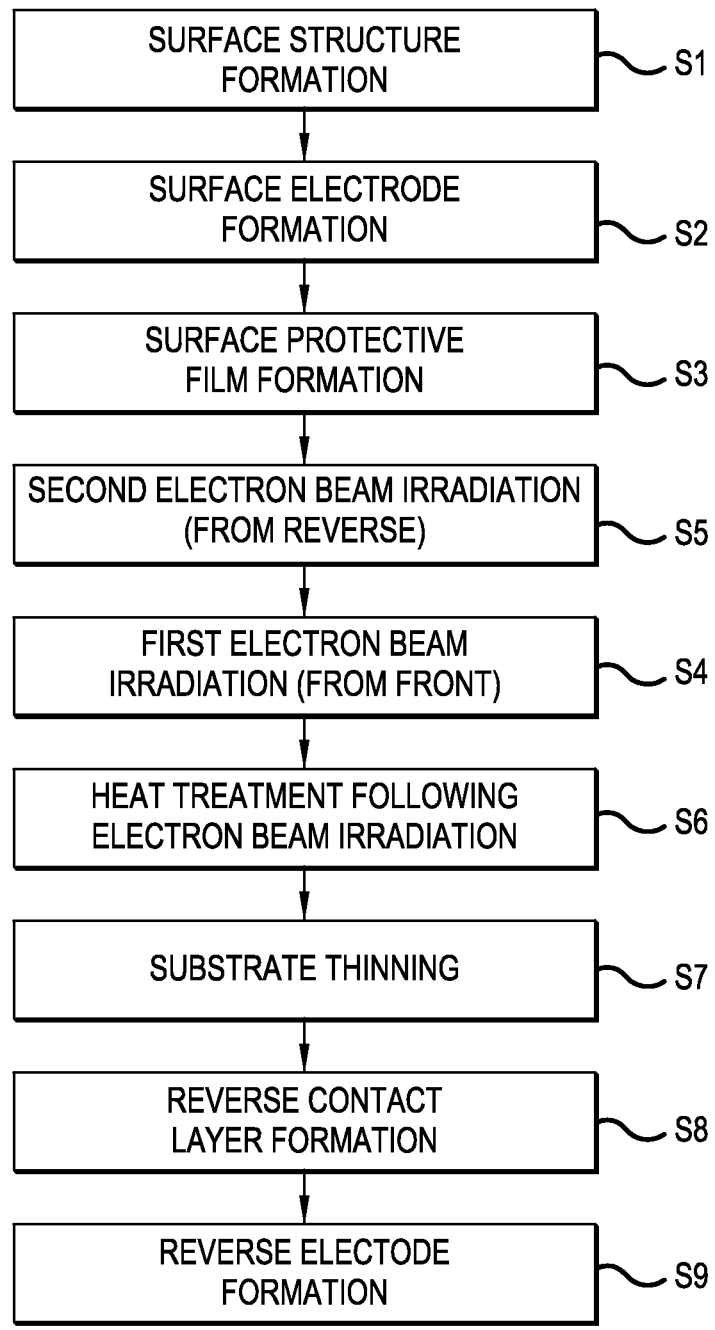
FIG. 19 is a manufacturing process flow chart showing another semiconductor device manufacturing method of the first embodiment of the invention.

FIG. 18 and FIG. 19 are flow charts showing the process of forming the semiconductor device of the invention. FIG. 18 is a manufacturing process flow chart showing the semiconductor device manufacturing method of the first embodiment of the invention. In FIG. 18, the step of forming the source electrode and other surface electrodes (Step S2) is performed after the step of forming the surface structure up through the interlayer insulating film (Step S1). This may be followed by a step of forming a surface protective film (Step S3) to improve moisture resistance and the like. Next, the first electron beam irradiation step (Step S4) is performed at a specific dose from the front side of the wafers, the wafer case is inverted, and the second electron beam irradiation step (Step S5) is performed from the reverse side of the wafers at the same dose as S4. Heat treatment following electron beam irradiation (Step S6) implemented to obtain a thinner wafer by polishing is then performed for a specific time at a specific temperature so as to reduce the density of lattice defects to a specific value while maintaining uniformity. This is followed by a wafer substrate thinning step (Step S7), a reverse contact layer formation step (Step S8) in which a high-concentration n-type contact layer is formed on the ground surface, and finally a reverse electrode formation step (Step S9) to form the drain electrode. The n-type reverse contact layer formation step S8 may also be omitted when arsenic is used as a dopant in the n-type high-concentration substrate.

The order of the first electron beam irradiation step (Step S4) and the second electron beam irradiation step (Step S5) may also be transposed. That is, the second electron beam irradiation step (S5) may be performed first from the reverse side of the wafer, after which the wafer case may be inverted and the first electron beam irradiation (S4) performed from the front side of the wafer. FIG. 19 is another manufacturing process flow chart showing the semiconductor device manufacturing method of this first embodiment of the invention. As shown in FIG. 19, Step S4 is performed after Step S5.

Figure 20:
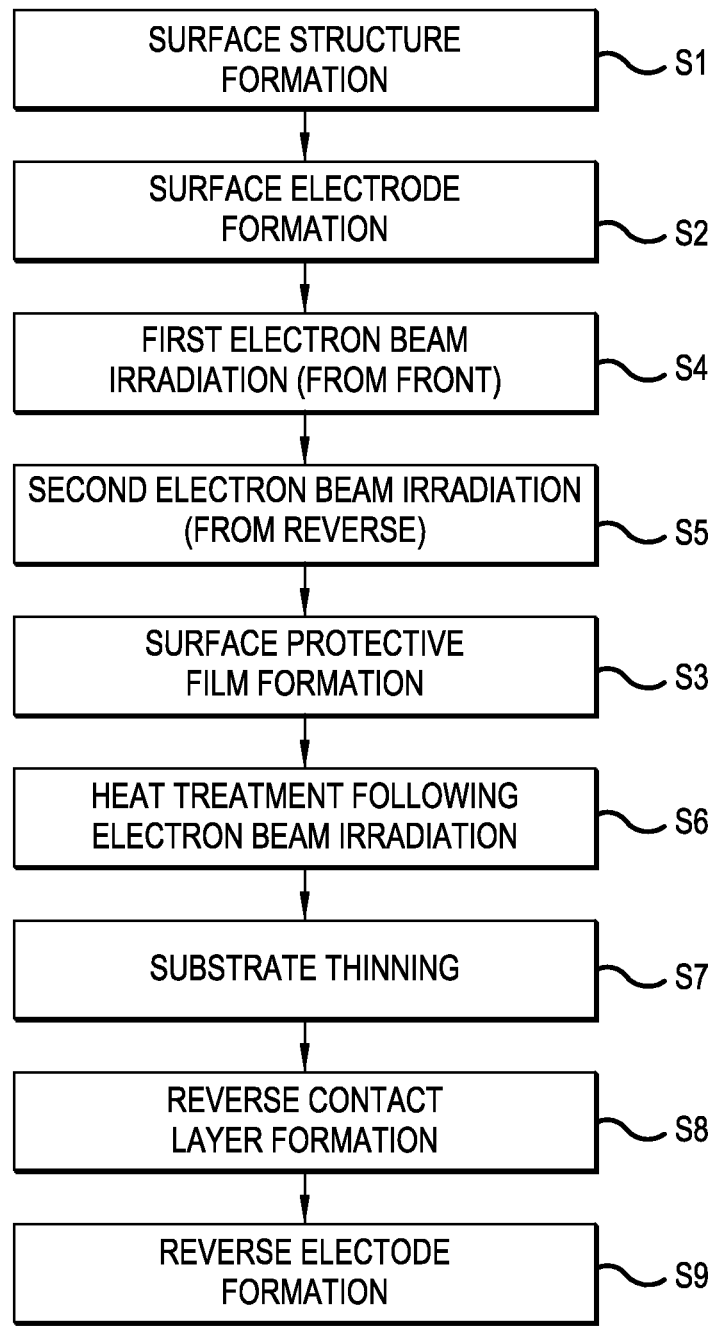
FIG. 20 is a manufacturing process flow chart showing another semiconductor device manufacturing method of the first embodiment of the invention.

The order of the steps other than Steps S4 and S5 may also be changed appropriately. For example, the surface protective film formation step S3 may be performed after the first electron beam irradiation step S4 or the second electron beam irradiation step S5. FIG. 20 is another manufacturing process flow chart showing the semiconductor device manufacturing method of the first embodiment of the invention. As shown in FIG. 20, the surface protective film formation step S3 may be performed after the first electron beam irradiation step S4 and second electron beam irradiation step S5, followed by the step S6 of heat treatment following electron beam irradiation.

Moreover, the step of forming a surface protective film (S3) may be implemented after the step of electron beam irradiation (S6).

Figure 21:
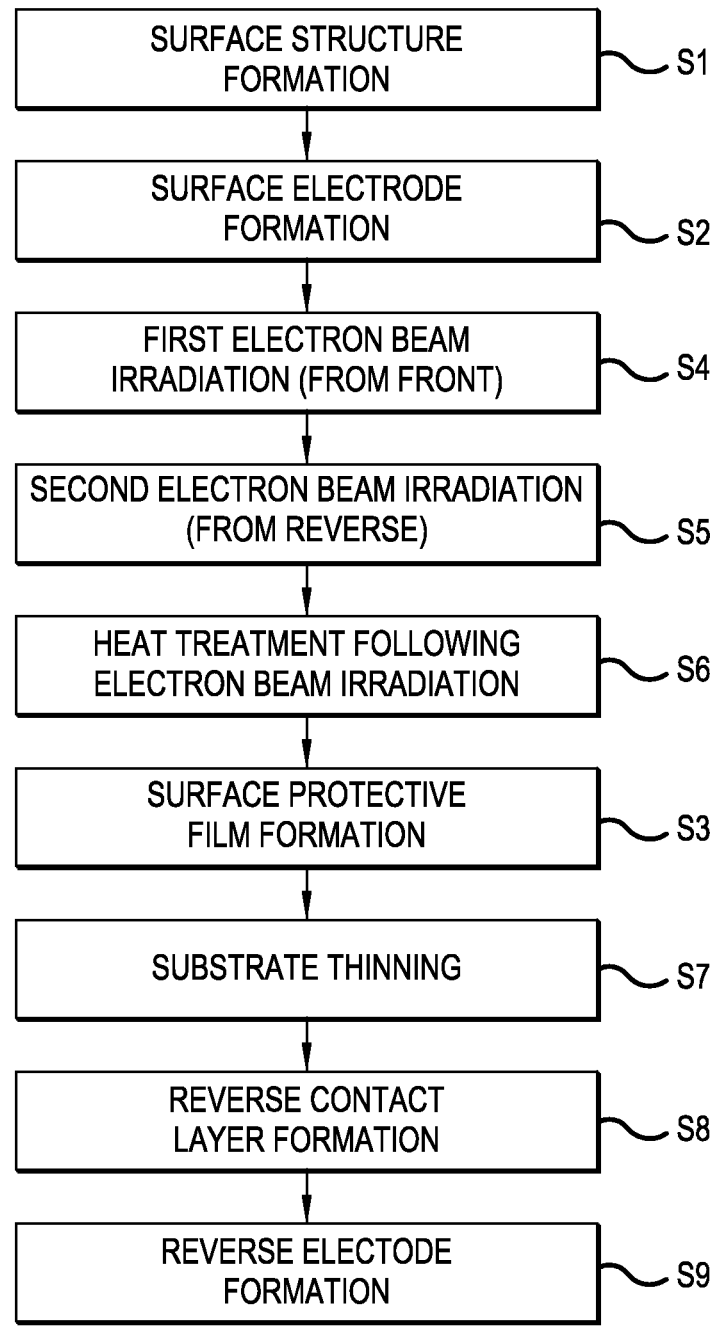
FIG. 21 is a manufacturing process flow chart showing another semiconductor device manufacturing method of the first embodiment of the invention.

FIG. 21 is another manufacturing process flow chart showing the semiconductor device manufacturing method of the first embodiment of the invention. As shown in FIG. 21, the surface protective film formation step S3 may also be performed after the step S6 of heat treatment following electron beam irradiation. In particular, since an organic film of polyimide as the surface protective film is formed at a temperature that is similar to or slightly higher than (350 to 400° C.) the temperature for heat treatment following electron beam irradiation (300 to 350° C.), the step with the higher treatment temperature may be performed first. The density of lattice defects caused by electron beam irradiation can thus be reduced to the desired value in the step S6 of heat treatment following electron beam irradiation, and unexpected drops in the lattice defect density caused by the treatment temperature in subsequent steps can be prevented.

Figure 22:
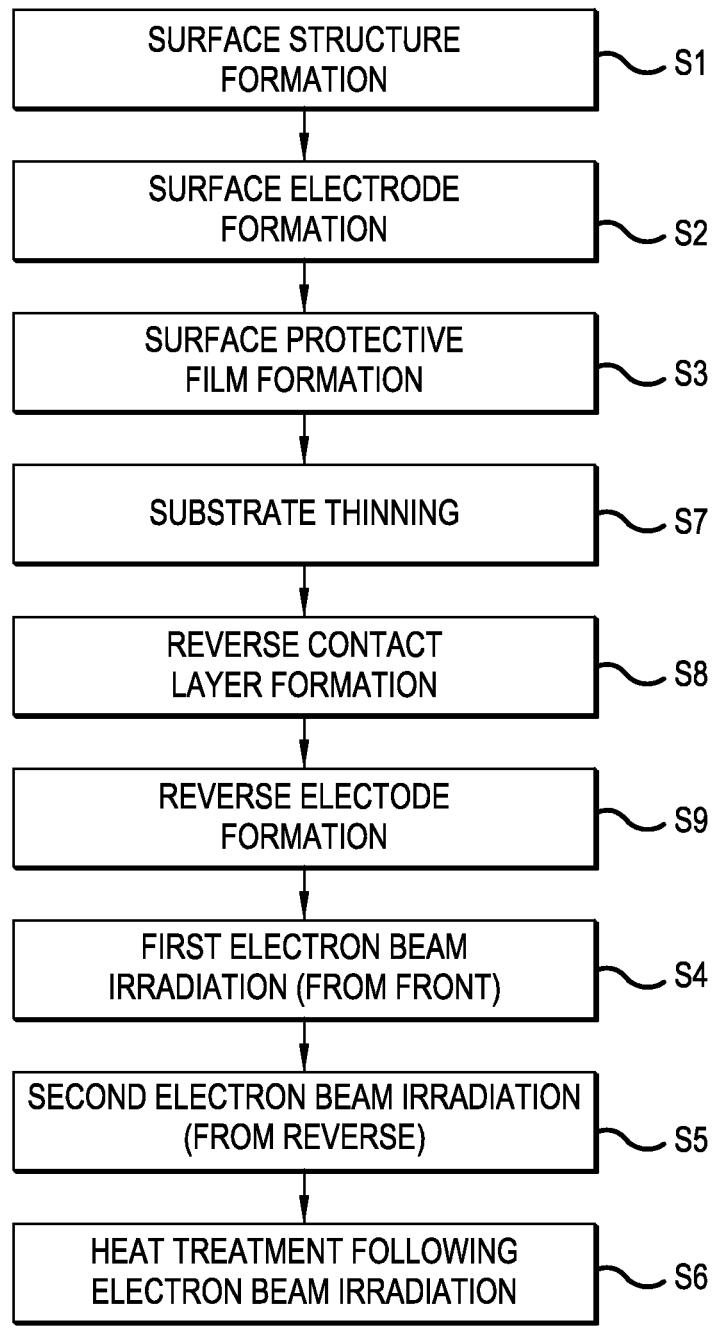
FIG. 22 is a manufacturing process flow chart showing another semiconductor device manufacturing method of the first embodiment of the invention.

The first electron beam irradiation step S4, second electron beam irradiation step S5 and heat treatment following electron beam irradiation step S6 may also be performed after the reverse electrode formation step S9. FIG. 22 is another manufacturing process flow chart of the semiconductor device manufacturing method of the first embodiment of the invention. As shown in FIG. 22, the first electron beam irradiation step S4, second electron beam irradiation step S5 and heat treatment following electron beam irradiation step S6 may also be performed after the reverse electrode formation step S9. This means that when the treatment temperature for forming the reverse contact layer or the reverse electrode is higher than the treatment temperature in the heat treatment following electron beam irradiation step S6, the density of lattice defects caused by electron beam irradiation can be reduced to the desired value in the heat treatment following electron beam irradiation step S6. Moreover, it is also possible to prevent unexpected drops in the lattice defect density at the treatment temperatures in the steps following the heat treatment following electron beam irradiation step S6.

Figure 23:
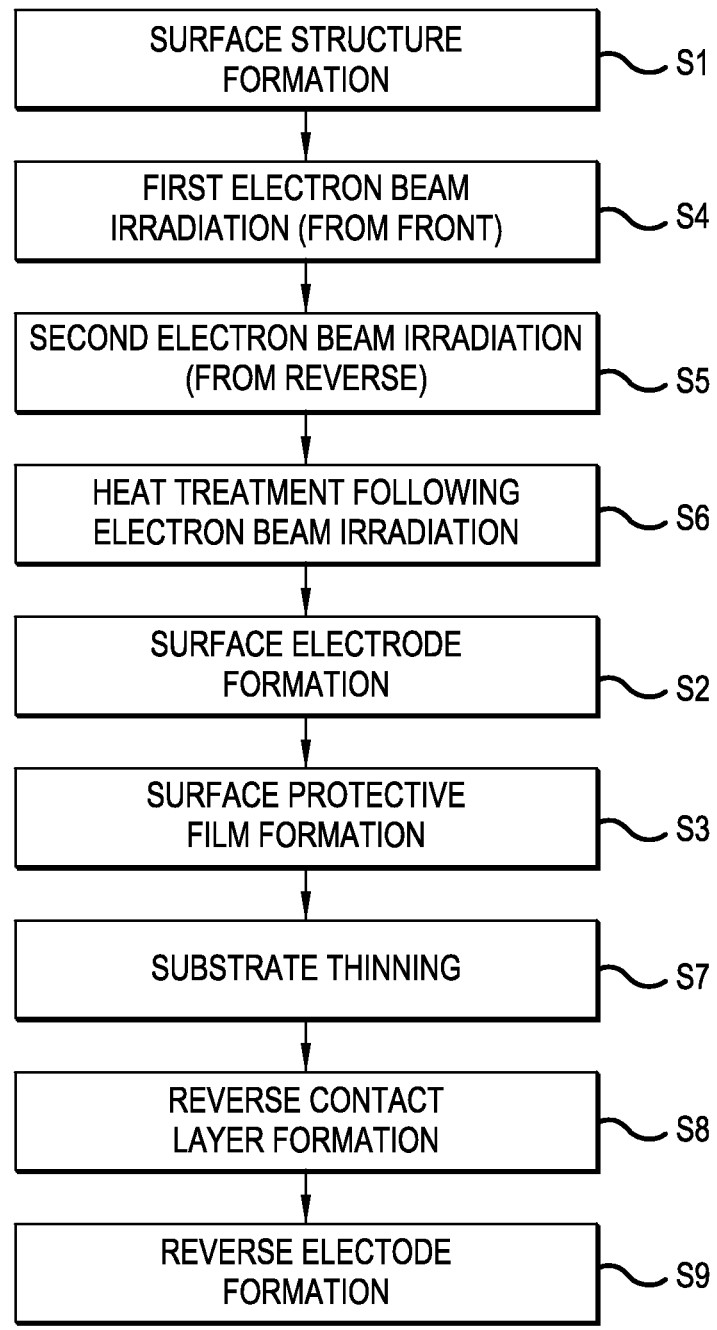
FIG. 23 is a manufacturing process flow chart showing another semiconductor device manufacturing method of the first embodiment of the invention.

Alternatively, these may be performed after the surface structure formation step S1 but before the surface electrode formation step S2. FIG. 23 is another manufacturing process flow chart of the semiconductor device manufacturing method of the first embodiment of the invention. In FIG. 23, the first electron beam irradiation step S4, second electron beam irradiation step S5 and heat treatment following electron beam irradiation step S6 are performed after the surface structure formation step S1. The surface electrode formation step S2 and subsequent step may then be performed next. The order of steps shown in FIG. 23 is discussed below. Also, the orders of the first electron beam irradiation step S4 and second electron beam irradiation step S5 in FIGS. 20 to 23 may be transposed as discussed above with reference to FIG. 19.

The relationship between heat treatment following electron beam irradiation and the gate threshold value is explained next. The gate threshold value is lower with electron beam irradiation than without electron beam irradiation. This decrease in the gate threshold value can be combatted by changing the impurity concentration of the p-type base layers or the thickness of the gate insulating films in advance, but another strategy is to repair lattice defects occurring near the boundaries with the gate insulating films of the p-type base layers where the channels (electron inversion layers) are formed. This is because once the gate threshold value has been altered by lattice defects, it may continue to fluctuate over a long period of time, reducing the long-term reliability of the MOSFET. This decline in gate threshold value can be restored by heat treatment following electron beam irradiation and, in this case, the atmosphere for heat treatment following electron beam irradiation can be a hydrogen-containing atmosphere. The reason for this is that the hydrogen terminates the aforementioned lattice defects near the boundary, particularly the dangling bonds, reducing the effects of the defects on the channels (electron inversion layers).

If a titanium (Ti) or other barrier metal has already been formed on the surface electrode (source electrode) at the stage of heat treatment following electron beam irradiation, the degree of recovery in the gate threshold value will be less. Thus, when titanium or the like has been formed, as explained above, the threshold value may be adjusted in advance in anticipation of a decrease in the gate threshold value, such as increasing the ion implantation concentration when forming the p-type base layer. Alternatively, as shown in FIG. 23, the step S2 of forming the surface electrode containing the barrier metal may be performed after the step S6 of heat treatment following electron beam irradiation. In this way, the dangling bonds near the channel are terminated with hydrogen without being affected by the barrier metal. When the order of steps is as shown in FIG. 23, the treatment temperature for the surface electrode forming step (200 to 350° C., for example) can be lower than the treatment temperature for the heat treatment following electron beam irradiation step S6 (300 to 380° C., for example), using low-temperature sputtering of the barrier metal. It is thus possible to reduce the density of lattice defects caused by electron beam irradiation to the desired value by heat treatment following electron beam irradiation S6, and to prevent an unexpected decline in lattice defect density due to the treatment temperatures in subsequent steps.

The technical features of the present invention are explained next.

Figure 5:
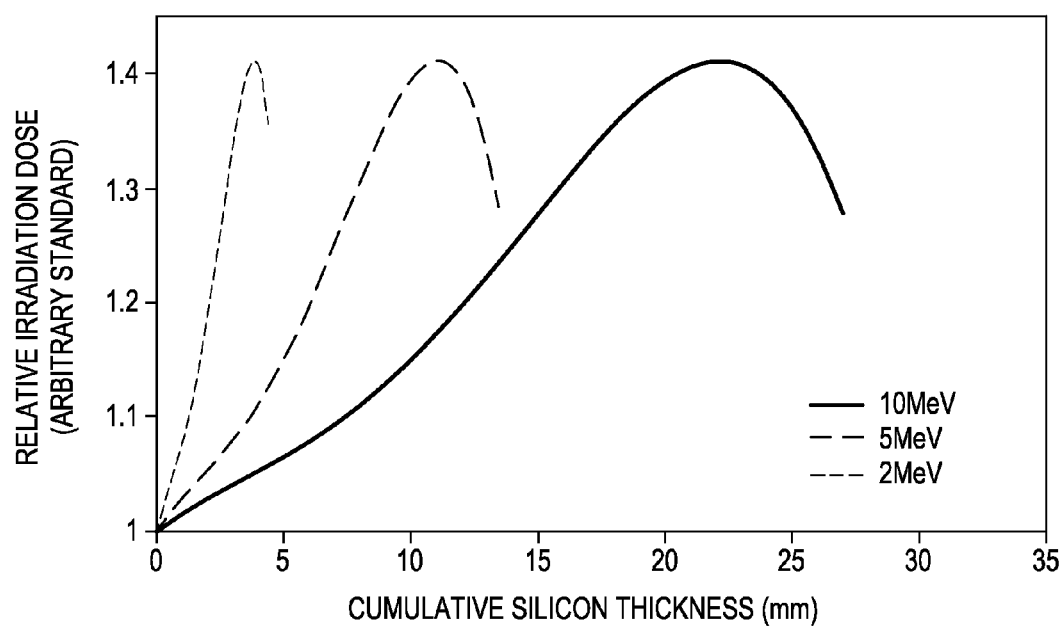
FIG. 5 is a distribution chart showing the relative irradiation doses of the semiconductor wafers.

FIG. 5 is a distribution graph showing the relative irradiation doses of semiconductor wafers 10 relative to the cumulative thickness (total thickness) of semiconductor wafers 10 when one side of wafer stack 100 of stacked semiconductor wafers 10 (silicon) of any thickness was irradiated with an electron beam from one side. The relative irradiation doses (hereunder called relative doses) on the vertical axis have been normalized using the irradiation dose of the electron beam on the irradiated surface of semiconductor wafers 10. As discussed below, when there are multiple semiconductor wafers 10 the surface irradiated by the electron beam is the incidence surface of semiconductor wafer 10 first exposed to the electron beam. The electron beam produces an irradiation dose distribution in the semiconductors that is dependent on the electron stopping power of the semiconductor (silicon) and the acceleration energy of the electron beam. The shape of this irradiation dose distribution roughly matches the shape of the concentration distribution of crystal defects created in the semiconductors by electron beam irradiation. That is, because the concentration distribution of the crystal defects is determined by the irradiation dose of the semiconductor, it generally approximates a Gaussian distribution. Therefore, the range Rp increases as the acceleration energy of the electron beam increases as shown in FIG. 5.

In fact, in FIG. 5 it can be said that the distribution of the irradiation dose (or crystal defect concentration) exhibits a steady and linear increase from the outermost surface of semiconductor wafers 10 to just before (a few mm before) the range Rp. As a result, the difference in irradiation dose between semiconductor wafer 10 on the outermost surface irradiated with the electron beam and semiconductor wafer 10 close to Rp is nearly 40%. Such variation in irradiation dose causes variability of characteristics because it upsets the uniformity of the crystal defect density distribution between semiconductor wafers 10. The use of power MOSFETs as in the first embodiment will have impact on variability in the conduction loss of the body diode (forward voltage drop) and the reverse recovery characteristics (reverse recovery time, maximum reverse recovery current, etc.).

To avoid such variation in the irradiation dose between semiconductor wafers 10 in wafer stack 100, the polymer case is turned upside-down as discussed above, and wafer stack 100 is irradiated with the electron beam from the reverse side under the same irradiation conditions. This irradiation method is called two-sided irradiation hereunder. Moreover, the conventional electron beam irradiation method in which the stack is irradiated from only one side called one-sided irradiation to distinguish it from two-sided irradiation.

Second Embodiment

FIGS. 2(a) and 2(b) show the manufacturing process for a semiconductor device of the second embodiment. The difference between this and the first embodiment is that wafer stack 100 is formed by stacking more than two semiconductor wafers 10, such as 10 wafers, for example.

As can be seen from FIG. 5, the greater the number of semiconductor wafers 10 in wafer stack 100, the greater the variation (difference) in the irradiation dose with one-sided irradiation. By contrast, a very high degree of uniformity of the irradiation dose (crystal defect density distribution) can be obtained with two-sided irradiation, in which wafer stack 100 is irradiated with the electron beam from both sides, even if the number of wafers in wafer stack 100 is greater.

Figure 6:
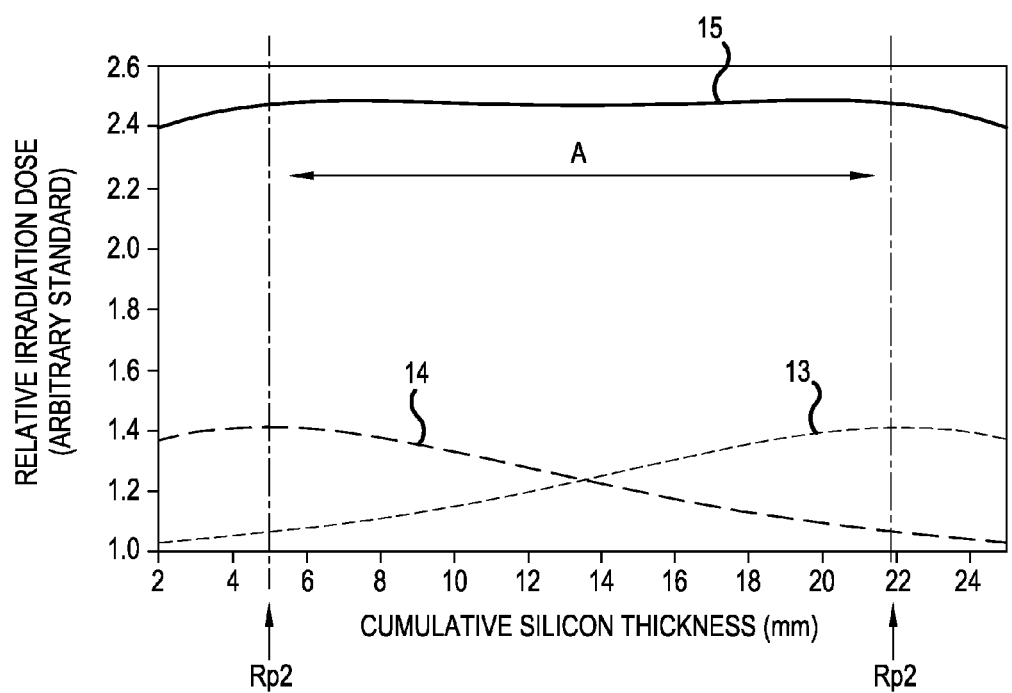
FIG. 6 is a distribution chart showing the relative irradiation doses of semiconductor wafers in the second embodiment of the invention.

In particular, the equalizing effect of the two-sided irradiation of the present invention on the defect density distribution is stronger the greater the number of wafers in wafer stack 100. This function effect is explained below. FIG. 6 is a graph of the relative irradiation dose distribution when two-sided irradiation was performed with an electron beam under the same conditions (acceleration energy, electron beam dose) from both the front and reverse sides of wafer stack 100. As in FIG. 5, the values on the vertical axis have been normalized using the irradiation dose on the outermost surface of semiconductor wafer 10 closest to the electron beam source in wafer stack 100. First irradiation dose distribution 13 in the first electron beam irradiation step S4 and the second irradiation dose distribution 14 in the second electron beam irradiation step S5 are axisymmetric distributions relative to the approximate center of wafer stack 100. The irradiation dose distribution of semiconductor wafers 10 in wafer stack 100 after completion of the second electron beam irradiation step S5 is as shown by the total irradiation dose distribution 15. The total irradiation dose distribution 15 is roughly uniform in the region A (corresponding to the respective irradiation surfaces), rather than at the range (Rp1) at which first irradiation dose distribution 13 is greatest or the range (Rp2) of second irradiation dose distribution 14, indicating good uniformity. In particular, the width (standard deviation) of the irradiation dose distribution in region A is roughly 0.5%, indicating much greater uniformly in comparison with the variation (roughly 40%) obtained with one-sided irradiation.

In fact, the electron beam dose during irradiation from the first side and second side in the two-sided irradiation method can be made smaller than the electron beam dose with one-sided irradiation alone, but even so the uniformity of the defect density distribution is extremely high with two-sided irradiation. The method of calculating the electron beam dose in two-sided irradiation is explained below.

In two-sided irradiation using multiple irradiations with an electron beam, a pair of irradiations consisting of one irradiation operation from the front surface and one irradiation operation from the reverse surface may be repeated multiple times. Alternatively, irradiation from the front surface may be repeated multiple times, after which irradiation from the reverse surface is repeated multiple times. The second alternative is desirable because it makes the process easier, but care is needed to ensure that the number of irradiations is the same on the front and reverse surfaces.

Third Embodiment

Figure 3:
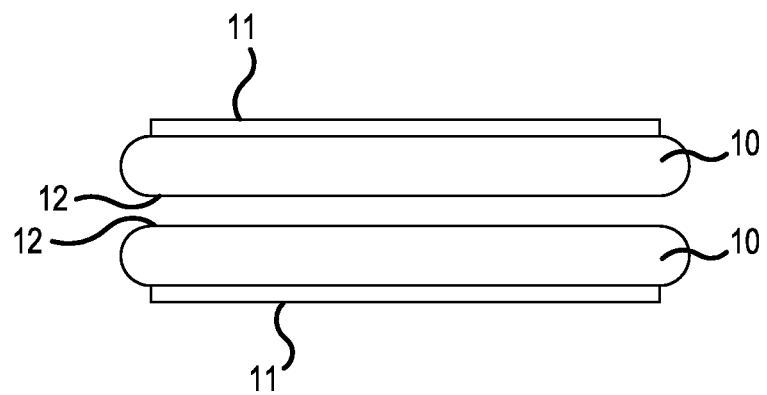
FIG. 3 is a main component cross-sectional structural diagram of the third embodiment of the invention.

FIG. 3 shows a cross-section in the process of manufacturing a semiconductor device of the third embodiment. The difference between this and the first embodiment is that the surface of the second semiconductor wafer 10 facing the reverse surface 12 of the first semiconductor wafer 10 is also a reverse surface 12. The advantage of two-sided irradiation is that it increases the uniformity of the irradiation dose (or crystal defect density) distribution as shown in FIG. 6. The variation between wafers can be further absorbed by arranging the wafers with an alternating orientation of front surfaces 11 and reverse surfaces 12 as in this third embodiment. The uniformity of the element characteristics can thereby be further improved.

Fourth Embodiment

Figure 4:
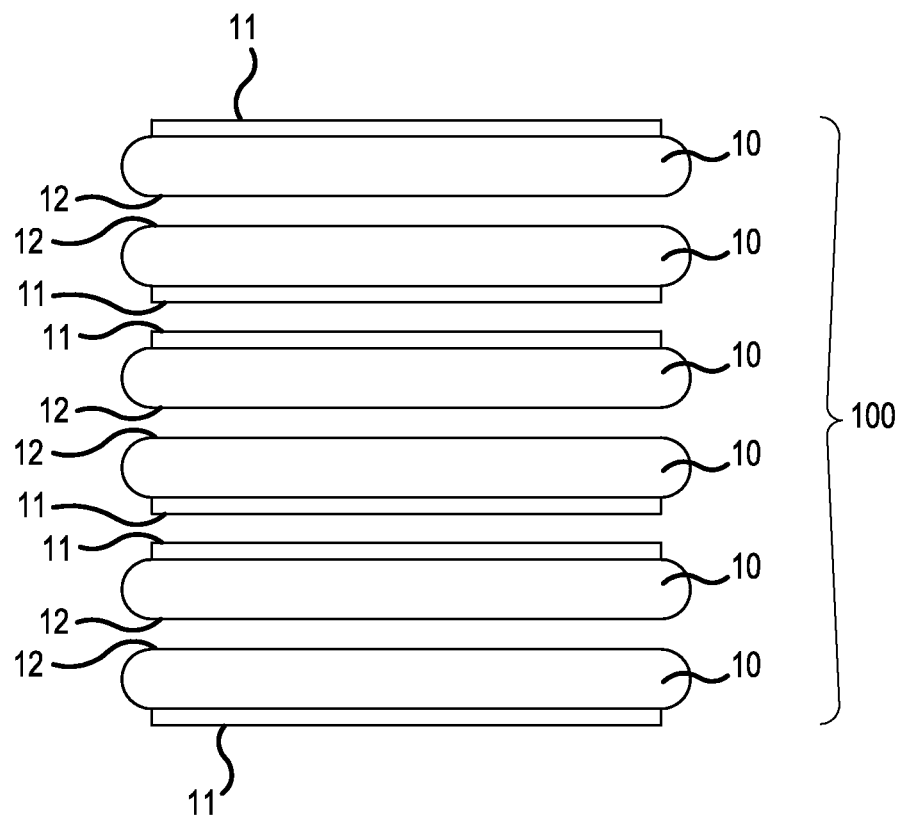
FIG. 4 is a main component cross-sectional structural diagram of the fourth embodiment of the invention.

FIG. 4 shows a cross-section in the process of manufacturing a semiconductor device of the fourth embodiment.

The difference between this and the second embodiment is that wafer stack 100 is formed with semiconductor wafers 10 stacked so that front surfaces 11 face each other or reverse surfaces 12 face each other as in the third embodiment.

Ten semiconductor wafers 10, for example, each having multiple vertical MOSFETs arranged thereon (with each wafer having a thickness of about 200 µm to 1000 µm) are overlaid in a repeating pattern of front surface-reverse surface, reverse surface-front surface, front surface-reverse surface as shown in FIG. 4, and enclosed in a specialized polymer case.

Next, the stack is irradiated with an electron beam with an acceleration energy of 10 MeV. A dose of 10 kGy was repeated 20 times for a total of 200 kGy. At an acceleration energy of 10 MeV, the range of the electrons is about 20 mm, and with about 10 wafers, all of the stacked semiconductor wafers 10 can be thoroughly irradiated without reaching the range. The irradiation dose (or crystal defect density) of semiconductor wafers 10 increases from the outermost surface of semiconductor wafers 10 to the electron range, as shown in FIG. 5, but declines rapidly after reaching the range. Therefore, the cumulative thickness of semiconductor wafers 10 must be equal to or less than the electron range. In one-sided irradiation, a roughly 40% irradiation dose variation (irregularity) occurs between the wafer on the outermost surface irradiated by the electron beam and the last wafer on the opposite side. In particular, the cumulative thickness increases as the number of semiconductor wafers 10 increases, increasing the differences in irradiation dose and defect density distribution, and increasing the degree of irregularity. By inverting the wafer stack 100 together with the case and performing two-sided irradiation with the same electron beam dose on both sides, however, it is possible to cancel out differences in the irradiation dose and achieve more uniform characteristics.

Figure 2:
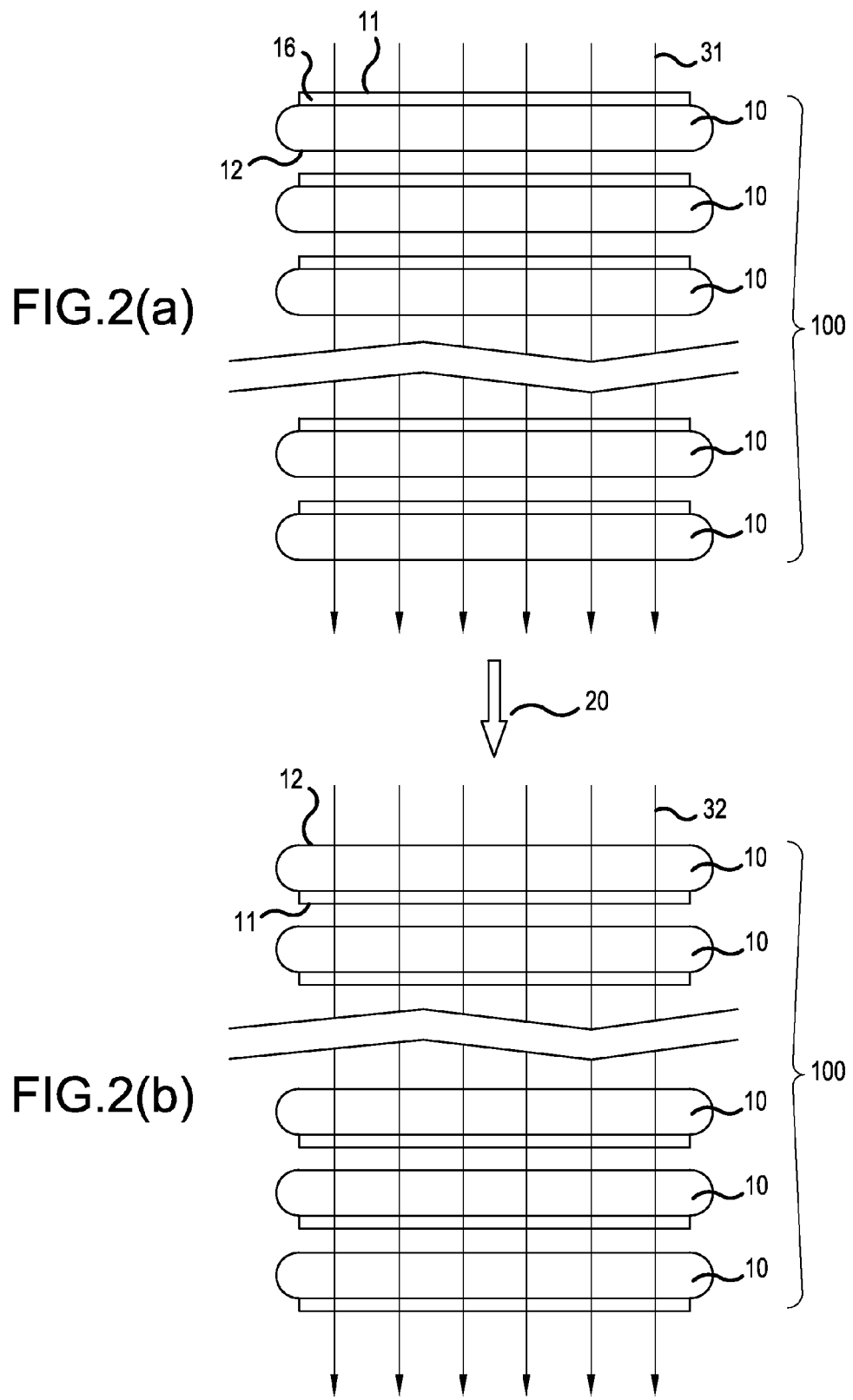
FIGS. 2(a) and 2(b) show a main component manufacturing-process diagram of the second embodiment of the invention.

This can be done with the wafers stacked with one orientation since the work efficiency is better when semiconductor wafers 10 are stacked with one orientation as shown in FIG. 2, but in this case the variation is somewhat (about 0.1%) greater. Thus, the fourth embodiment can be adopted when variation must be reduced and managed more strictly.

Fifth Embodiment

Figure 7:
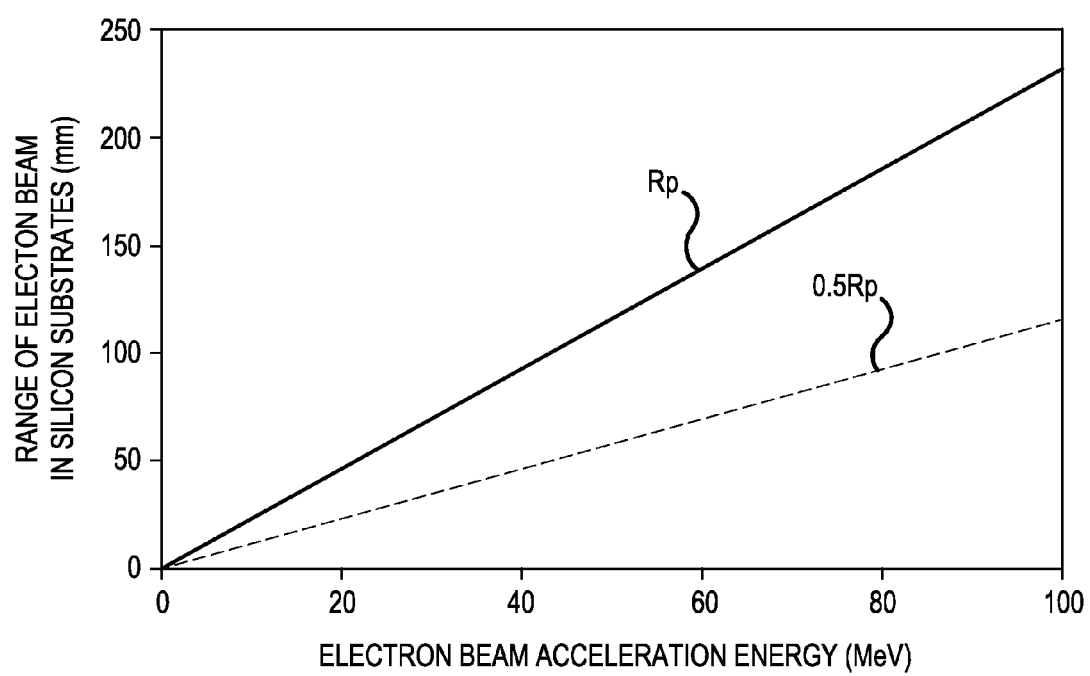
FIG. 7 is a graph of the characteristics in the fifth embodiment of the invention.

FIG. 7 shows the characteristics of a semiconductor device of the fifth embodiment.

The inventors discovered as a result of exhaustive research that given y as the range Rp (mm) of the electron beam in the silicon substrates of the wafer stack 100 and x as the acceleration energy E (MeV) of the electron beam, their relationship could be described by the formula $y=5.0 \times 10^{-7} x^4 - 9.0 \times 10^{-5} x^3 + 0.0046 x^2 + 2.2591 x - 0.3599$. This formula was graphed as shown in FIG. 7. That is, given W (mm) as the cumulative wafer thickness of wafer stack 100, W is set, for example, at 80% of the range Rp of the electron beam, and the acceleration energy of the electron beam that yields this 0.8 Rp is calculated by the aforementioned formula for performing two-sided electron beam irradiation. In this way, it is possible to perform electron beam irradiation at once (with the necessary number of irradiations to the irradiation dose) on multiple semiconductor wafers 10 in wafer stack 100, and to obtain a highly uniform irradiation dose and defect density distribution.

Alternatively, the above formula can be used to calculated the range Rp from the possible acceleration energy E of the electron beam irradiation device, and the cumulative wafer thickness W can be set at Rp or less, such as 0.8 Rp, based on this value.

More preferably, the crystal defect density distribution can be made still more uniform by setting the cumulative wafer thickness W at 50% of the range Rp. In particular, the defect density distribution increases in a more or less linear fashion up to a cumulative thickness of a few mm from the outermost wafer of wafer stack 100. As a result, uniformity is improved at depths sufficiently smaller than the range, such as 10 mm or less when the range is 20 mm.

Sixth Embodiment

The number of irradiations in two-sided irradiation in the first and second embodiments above is explained here.

Wafer stack 100 is irradiated from only one side by electron beam irradiation, and when introducing defects into semiconductor wafers 10, the wafer closest to the electron beam source receives the lowest irradiation dose. Since the electron beam irradiation is aimed at shortening the reverse recovery time and switching time, the electron beam irradiation must be performed with an irradiation dose sufficient to achieve the desired characteristics in the semiconductor wafer 10 closest to the electron beam source. For example, the necessary irradiation dose per semiconductor wafer 10 might be 100 kGy for obtaining desired characteristics. In this case, as discussed above, irradiation must be performed in such a way that the irradiation dose for the wafer closest to the electron beam source in stack 100 is 100 kGy. To this end, the acceleration energy of the electron beam is fixed at a specific acceleration energy in the range of, for example, 4 MeV to 10 MeV. Electron beam irradiation is then repeated 10 times with an electron beam dose of 10 kGy per time on one principal surface of the wafer stack 100 with this acceleration energy. The other principal surface, which is furthest from the electron beam source in the wafer stack, thus receives an irradiation dose of 150 kGy, for example, or in other words an excess of 50 kGy.

To reduce this discrepancy in irradiation dose, it is necessary to understand the distribution of the irradiation dose within the wafer stack. One way to confirm the irradiation dose is to prepare dose measurement chips or the like each time for monitoring purposes, incorporate the chips together with the wafers into the wafer stack before irradiation, and then implement electron beam irradiation and evaluate the doses. However, operation efficiency is reduced when monitors must be prepared for each irradiation.

Instead, the distribution percentages of the irradiation dose can be assessed in advance by exposing the monitors to the electron beam at a low irradiation dose. A low irradiation dose is, for example the irradiation dose to which an object is irradiated at the electron beam dose that can be used one time with an electron beam irradiating device. Given a fixed set of irradiation conditions including acceleration energy, dose of electron beam irradiation and the like, the distribution percentage of the irradiation dose relative to the direction of depth of the wafer stack is constant regardless of the size of the dose. Thus, when manufacturing a semiconductor device that requires an irradiation dose corresponding to 600 kGy, for example, it is not necessary to monitor a high dose such as 600 kGy, and the distribution data can be obtained with about 10 kGy. The electron beam dose directed at the monitor can also be the minimum irradiation unit of the irradiation device, for example.

Figure 8:
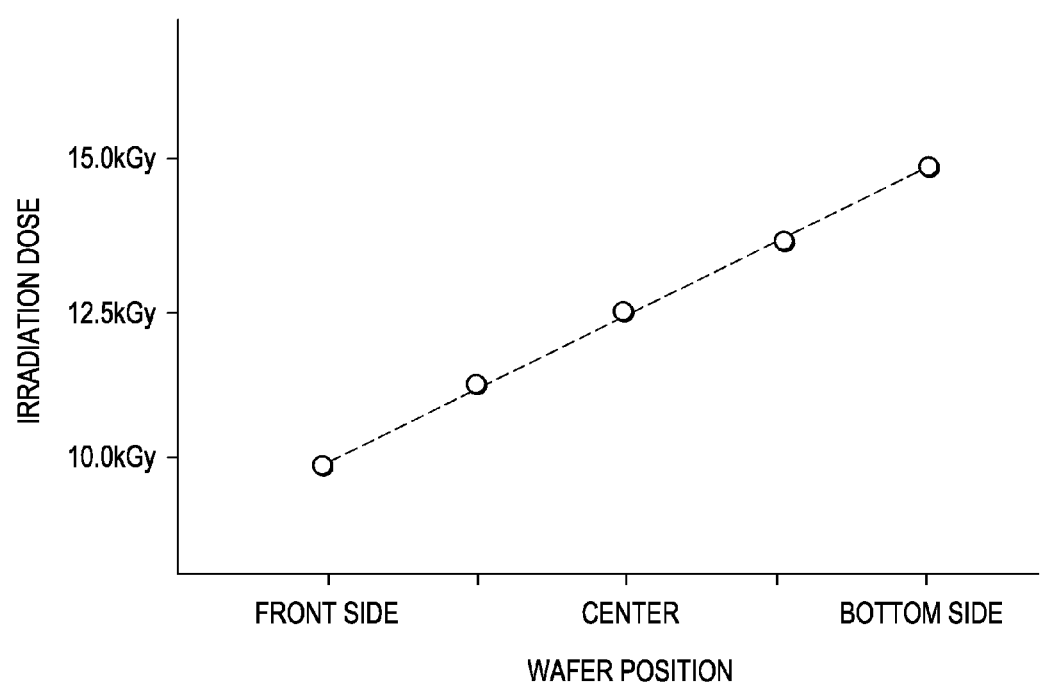
FIG. 8 is a graph of the characteristics in the sixth embodiment of the invention.

FIG. 8 is a graph showing the irradiation dose distribution with respect to semiconductor wafers 10 in wafer stack 100 when the irradiation dose of the semiconductor wafer closest to the electron beam source in wafer stack 100 is 10 kGy. The "bottom side" on the horizontal axis indicates semiconductor wafer 10 furthest from the electron beam source out of semiconductor wafers 10 in wafer stack 100. It can be seen from FIG. 8 that the irradiation dose per wafer increases in a more or less linear fashion with distance from the electron beam source.

Consider x as the irradiation dose of semiconductor wafer 10 on the outermost surface of wafer stack 100 (closest to the electron beam source), and y as the irradiation dose of the wafer on the bottom surface (furthest from the electron beam source). If the irradiation dose increases linearly as a function of the distance from the electron beam source, its average value is roughly (x+y)/2. Under conditions of x<y, a single electron beam dose is given as the irradiation dose x, and the minimum necessary irradiation dose for obtaining the desired characteristics as D. In the case of one-sided irradiation only, the necessary number of irradiations to electron beam irradiation is D/x. In the case of two-sided irradiation, however, the number of irradiations for both sides is D divided by the average irradiation dose (x+y)/2, or 2×D/(x+y). That is, fewer irradiations are required in two-sided irradiation than in one-sided irradiation at a rate of 2x/(x+y)<1. It is therefore possible to obtain greater uniformity of the irradiation dose between wafers as discussed above, and to reduce costs by reducing, for example, the number of irradiations.

Examples

Specific examples of the sixth embodiment are explained. The actual irradiation dose was calculated based on an irradiation dose distribution obtained as in FIG. 8, and used to calculate the desired multiple of irradiations. In the example shown in FIG. 8, the average value (median value) of the irradiation dose is (10 kGy+15 kGy)/2=12.5 kGy. This means that in two-sided irradiation, the actual dose obtained per irradiation is 1.25 times the electron beam dose on the outermost wafer in one-sided irradiation. The number of irradiations required in two-sided irradiation is 80% of the number required for the same irradiation in one-sided irradiation.

Figure 9:
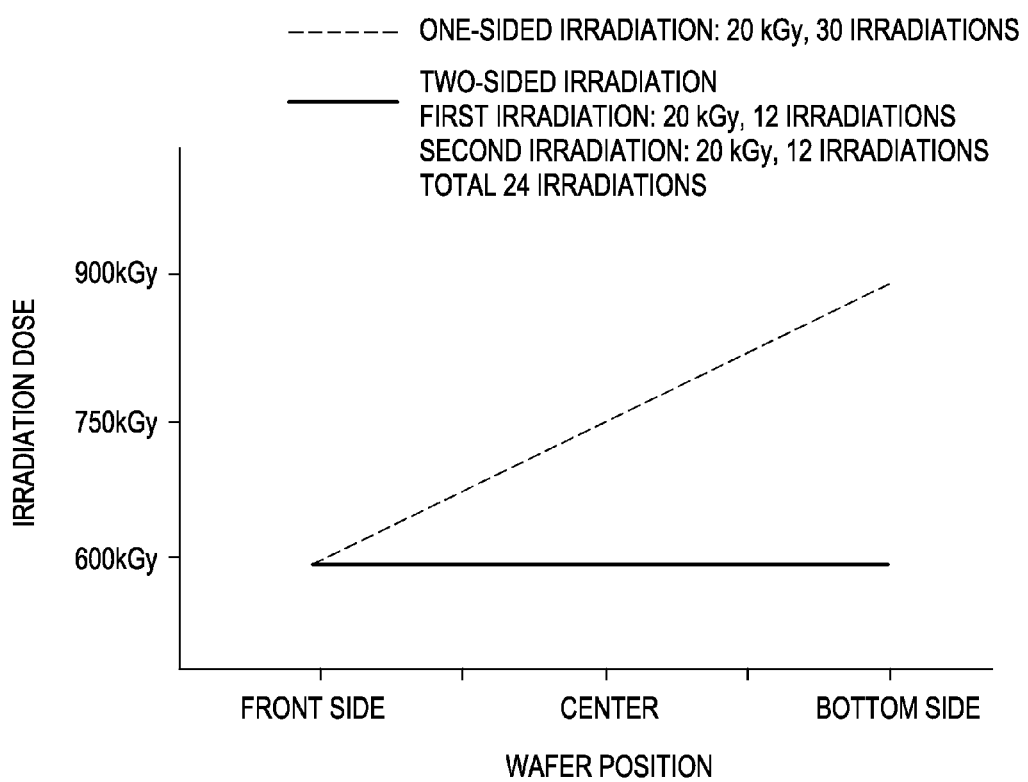
FIG. 9 is a graph of the characteristics in the sixth embodiment of the invention.

FIG. 9 shows the irradiation dose distribution of the wafers in a wafer stack when, after obtaining the distribution data in FIG. 8, electron beam irradiation was actually performed with the number of irradiations for electron beam irradiation set based on the data. As shown in FIG. 9, with one-sided irradiation the silicon must be exposed a total of 30 times to an electron beam dose of 20 kGy in order to obtain 600 kGy. By contrast, with two-sided 12 irradiations are required with an electron beam dose of 20 kGy per irradiation in the first electron beam irradiation step S4. After this, the wafer stack is inverted and the second electron beam irradiation step S5 is performed. In the second electron beam irradiation step S5, 12 irradiations are performed with an electron beam dose of 20 kGy per irradiation as in the first electron beam irradiation step S4. As a result, a total irradiation dose of 600 kGy for the stack as a whole can be achieved with an irradiance of 480 kGy (20 kGy×12) as the irradiation dose on the outermost wafer in one-sided irradiation.

Similarly, if an irradiation dose of 100 kGy per wafer is required, the irradiance level on the outermost wafer can be set at 80 kGy, for a dose of 40 kGy in both the first electron beam irradiation step S4 and second electron beam irradiation step S5. If the necessary irradiation dose per wafer is 1000 kGy, the irradiation dose of the outermost wafer can be set at 800 kGy, for a dose of 400 kGy in both the first electron beam irradiation step S4 and second electron beam irradiation step S5.

As long as the total irradiation dose (the total of the irradiation doses in the first electron beam irradiation step S4 and second electron beam irradiation step S5) is the same, the irradiation dose (dose per irradiation or number of irradiations) in the first electron beam irradiation step S4 may be different from the irradiation dose (dose per irradiation or number of irradiations) in the second electron beam irradiation step S5. This is because the variation (discrepancy) in the irradiation dose relative to the silicon thickness is always reduced by performing electron beam irradiation from both sides rather than from just one side. As a simplified theoretical example, electron beam irradiation could be performed from the front side at an irradiation dose of 100 kGy with a specific acceleration energy (such as 10 MeV as in FIG. 5), and then performed from the reverse side at an acceleration energy of 1 GeV, at least 100 times the acceleration energy on the front side. It is thought that the irradiation dose distribution in electron beam irradiation at 1 GeV is roughly flat in comparison with the irradiation dose distribution at 10 MeV because the electron range is sufficiently long. Even if the irradiation dose for electron beam irradiation at 1 GeV is changed to 10 kGy (10% of the irradiation dose on the front side), the irradiation dose distribution after two-sided irradiation is the distribution of an irradiation dose of 110 kGy on average. With one-sided irradiation alone, if the maximum value of the relative dose for electron beam irradiation at 10 MeV from the front side is 1.5 and the minimum value is 1.0, the ratio of the maximum value of the relative dose to the minimum value is 1.5. By contrast, if electron beam irradiation is then performed at an irradiation dose of 10 kGy from the reverse side, the level of the irradiation dose is raised such that the ratio of the maximum value of the relative dose to the minimum value is (1.5+0.1)/(1.0+0.1)=1.45, a definite reduction in variation.

Figure 26:
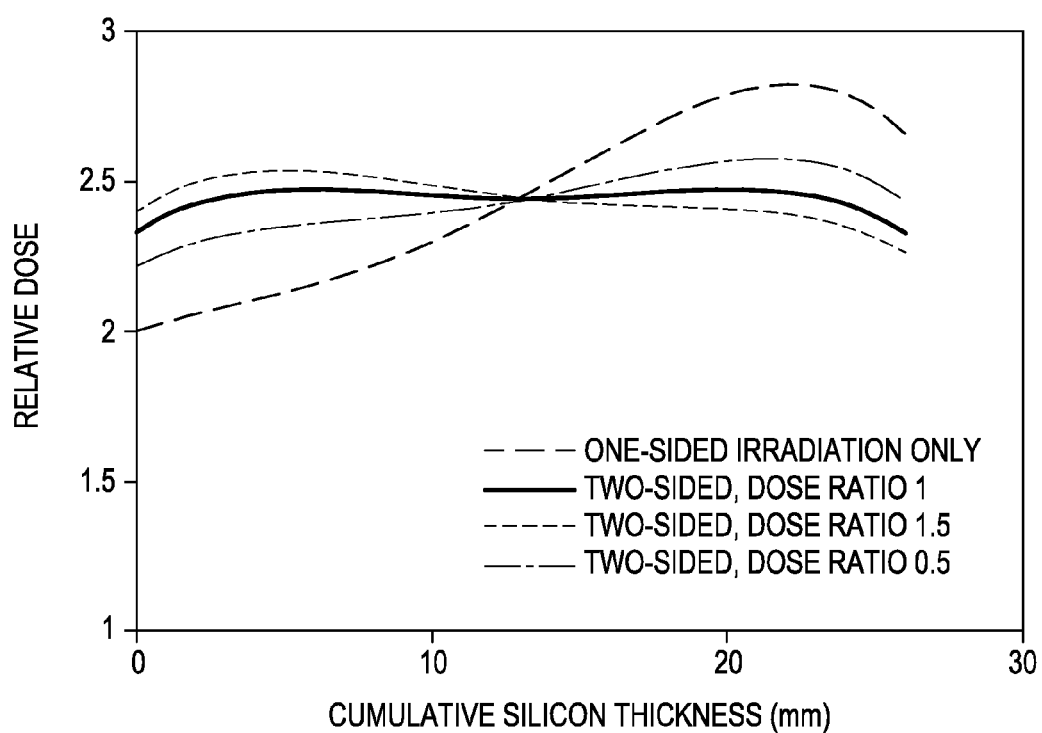
FIG. 26 is a distribution graph showing the relative irradiation doses of the semiconductor wafers of the sixth embodiment of the invention.

FIG. 26 is a distribution graph showing the relative irradiation doses of the semiconductor wafers of the sixth embodiment of the invention. The long broken line shows the distribution of relative doses when electron beam irradiation was performed at 10 MeV from one side only (the front side, for example) with an arbitrary irradiation dose a (units in kGy, for example). By contrast, the solid line shows the distribution of relative doses when two-sided irradiation was performed at the same acceleration energy with an irradiation dose of 0.5a from the front side and with an irradiation dose of 0.5a from the reverse side. As discussed above, the coefficient a is corrected so that the total irradiation dose is the same as the total irradiation dose with one-sided irradiation.

The value of the irradiation dose of the electron beam from one principal side (the reverse side, for example) divided by the irradiation dose of the electron beam from the other principal side (the front side, for example) is defined as the dose ratio. The dose ratio as indicated by the long broken line is 0.5a/0.5a=1.0. If the dose ratio is 1.0 or more, its inverse number is equivalent to the value obtained by simply interchanging the irradiation directions of the front and reverse sides. Thus, the range of the dose ratio is greater than 0 and no greater than 1. A dose ratio of 0 means one-sided irradiation.

The short broken line in FIG. 26 shows the distribution of relative doses when two-sided electron beam irradiation was performed in the same way with an irradiation dose of 0.4a from the front sided and an irradiation dose of 0.6a from the reverse side. The dose ratio is 1.5. The dotted broken line shows the distribution of relative doses when two-sided electron beam irradiation was performed in the same way with an irradiation dose of 0.66a from the front side and an irradiation dose of 0.33 a from the reverse side. The dose ratio is 0.5. In contrast to the long broken line for one-sided irradiation only, the line that nearest approaches a flat relative dose distribution is the one representing the same irradiation dose on the front and reverse sides, or in other words a dose ratio of 1.0. On the other hand, when the irradiation dose from the reverse side is 1.5 times or 0.5 times the dose from the front side, or in other words when the irradiation doses are different on the front and reverse sides, the difference between the maximum and minimum values of the relative dose distribution is also smaller than with one-sided irradiation alone, indicating an improvement in variation of the relative dose distribution. Thus, variation is improved when electron beam irradiation is performed by two-sided irradiation of the wafers (stack), even if the doses are different on the front and reverse sides.

Theoretically, variation is improved as discussed above even if the dose ratio is 0.1 or less. On the other hand, the irradiation dose ratio for actual irradiation can be in the range of 0.1 to 1, or preferably 0.2 to 1, or more preferably 0.5 to 1, or still more preferably 0.8 to 1, or yet more preferably 0.9 to 1. The degree of variation of the relative dose is obviously reduced by these preferable ratios. This is then certain to be reflected in a reduction in variation of the electrical characteristics of the device, including the reverse recovery characteristics of the body diodes of the MOSFET. In other words, even if the irradiation dose from one surface of a multiple wafer stack is different from the irradiation dose from the other surface, variation in the electrical characteristics among the wafers is sufficiently low if electron beam irradiation is two-sided.

Seventh Embodiment

Figure 24:
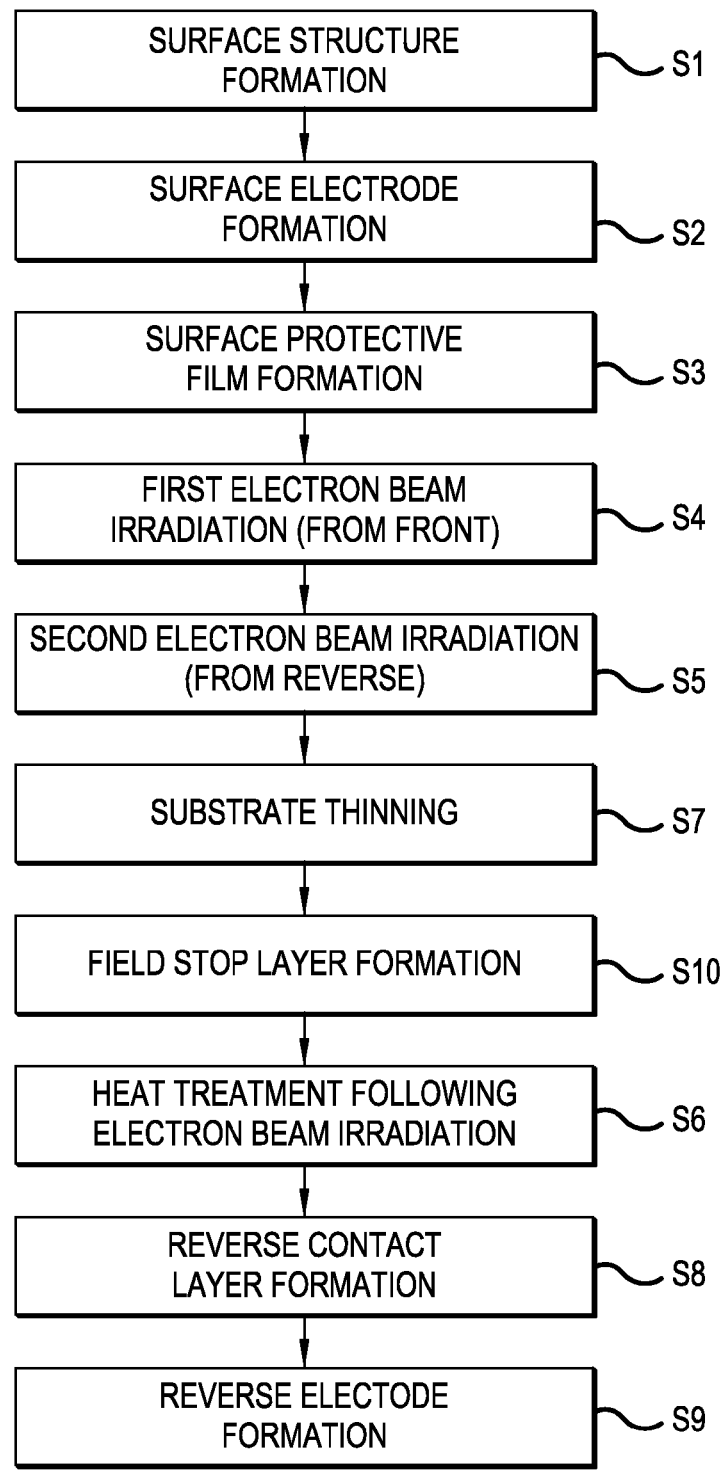
FIG. 24 is a manufacturing process flow chart showing the semiconductor device manufacturing method of the seventh and eighth embodiments of the invention.

In the seventh embodiment, the manufacturing method of the first embodiment is applied to an IGBT. FIG. 24 is a manufacturing process flow chart showing the semiconductor device manufacturing method of the seventh embodiment of the invention. The process flow in the manufacturing method of the seventh embodiment is basically the same as in FIG. 18 and FIG. 19 of the first embodiment, with the following differences.

First, in the case of an IGBT, a high-resistivity bulk cut wafer (FZ (float-zone) wafer, CZ wafer or MCZ (magnetic CZ) wafer) is used as the n-drift layer in the semiconductor substrate. Second, steps S1 to S5 are the same in principle, but because a bulk wafer is used, the reverse surface of the n-type drift layer itself is ground following the second electron beam irradiation step S5 (substrate thinning step S7). Third, after the substrate thinning step S7 an n-type dopant is introduced by ion implantation from the reverse side (the ground surface), for example, forming an n-type field stop layer. The n-type dopant is phosphorus, hydrogen or the like, for example. After this, the heat treatment following electron beam irradiation step S6 is performed, and the n-type field stop layer is activated at the same time. Fourth, in the reverse contact layer formation step S8 a p-type dopant such as boron is introduced into the ground surface instead of an n-type dopant, and activated by laser annealing or the like to form a p-type collector layer. This completes the IGBT.

Figure 25:
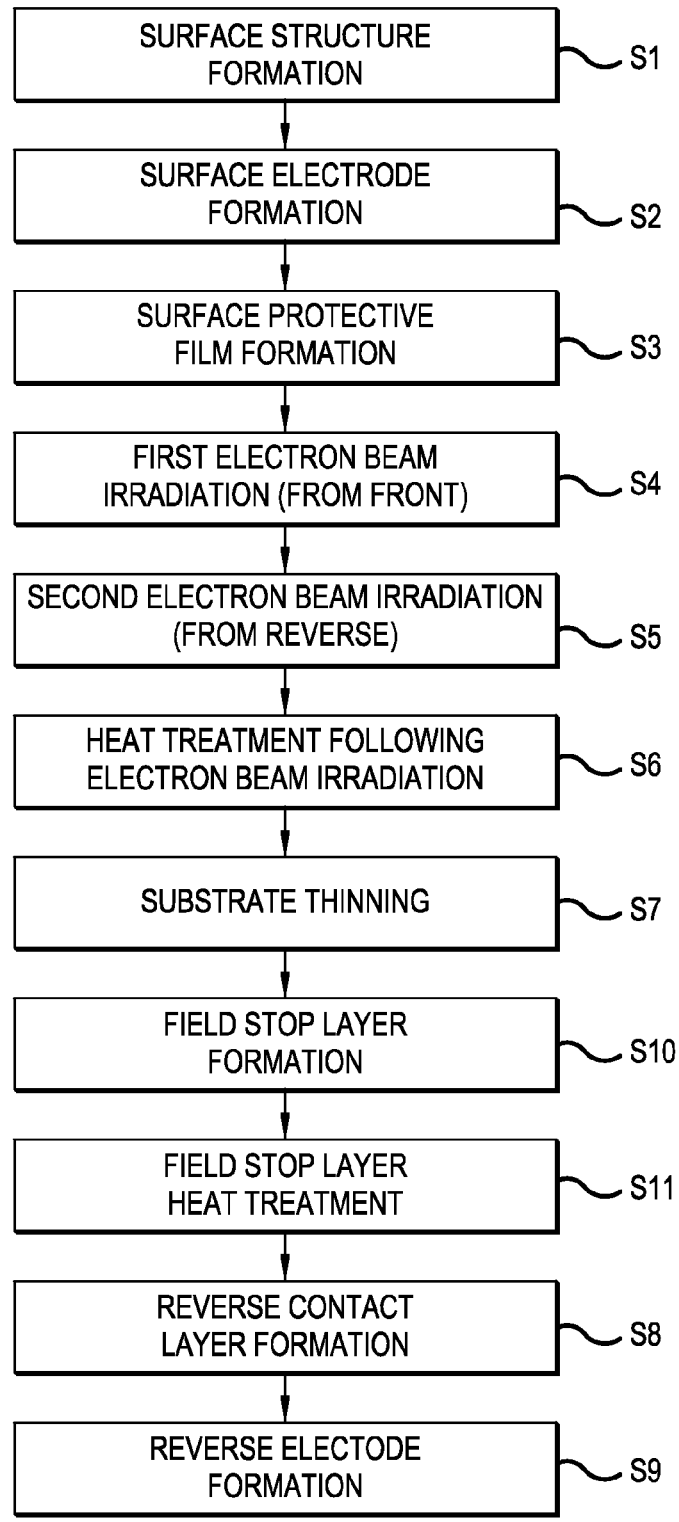
FIG. 25 is another manufacturing process flow chart showing the semiconductor device manufacturing method of the seventh and eighth embodiments of the invention.

Moreover, as shown in FIG. 25, the heat treatment following electron beam irradiation step S6 may be performed after the second electron beam irradiation step S5, and the field stop layer may be heat treated separately after the field stop layer formation step S10. FIG. 25 is another manufacturing process flow chart of the semiconductor device manufacturing method of the seventh embodiment of the invention. Although there are more steps, the lattice defects caused by electron beam irradiation can be controlled separately from the lattice defects occurring during formation of the field stop layer.

Of course, the manufacturing methods of the second through sixth embodiments are also applicable. In some cases, selenium could also be used as a dopant in the n-type field stop layer. In this case, the first electron beam irradiation step S4, second electron beam irradiation step S5 and heat treatment after electron beam irradiation step S6 are performed after the substrate thinning step S7 and after introduction and thermal diffusion of selenium in the ground surface. This is because the diffusion temperature for diffusion of selenium is a high temperature of 850 to 950° C.

IGBTs require high-speed operations, and with the manufacturing methods described above it is possible to provide an extremely uniform high-speed IGBT with no variation in lattice defect density.

Eighth Embodiment

In the eighth embodiment, the manufacturing method of the first embodiment is applied to a p-i-n diode (hereunder called a diode). The manufacturing process flow chart of the semiconductor manufacturing method of the eighth embodiment is the same as FIG. 24. The process flow in this manufacturing method of the eighth embodiment is basically the same as in FIG. 18 and FIG. 19 of the first embodiment, with the following differences.

First, in the case of a diode, a high-resistivity bulk cut wafer (FZ (float-zone) wafer, CZ wafer or MCZ (magnetic CZ) wafer) is used as the n-drift layer in the semiconductor substrate. Second, steps S1 to S5 are the same in principle, but because a bulk wafer is used, the reverse surface of the n-type drift layer itself is ground following the second electron beam irradiation step S5 (substrate thinning step S7). Third, after the substrate thinning step S7 an n-type dopant is introduced by ion implantation from the reverse side (the ground surface), for example, forming an n-type field stop layer. The n-type dopant is phosphorus, hydrogen or the like. After this, the heat treatment following electron beam irradiation step S6 is performed, and the n-type field stop layer is activated at the same time. Fourth, there is no need for MOS gates on the surface of the semiconductor substrate, and a p-type anode layer is formed, for example. This completes the diode.

As in the seventh embodiment, as shown in FIG. 25, the heat treatment following electron beam irradiation step S6 may be performed after the second electron beam irradiation step S5, and the field stop layer may be heat treated separately after the field stop layer formation step S10. FIG. 25 is another manufacturing process flow chart of the semiconductor device manufacturing method of the seventh embodiment of the invention. Although there are more steps, the lattice defects caused by electron beam irradiation can be controlled separately from the lattice defects occurring during formation of the field stop layer.

Of course, the manufacturing methods of the second through sixth embodiments are also applicable. In some cases, selenium could also be used as a dopant in the n-type field stop layer. In this case, the first electron beam irradiation step S4, second electron beam irradiation step S5 and heat treatment after electron beam irradiation step S6 are performed after the substrate thinning step S7 and after introduction and thermal diffusion of selenium in the ground surface. This is because the diffusion temperature for diffusion of selenium is a high temperature of 850 to 950° C.

By applying the manufacturing methods described above to a diode, which requires high-speed reverse recovery operations, it is possible to provide am extremely uniform high-speed diode with no variation in lattice density defects across all wafers by performing electron beam irradiation as lifetime control from both the front and reverse sides of the wafer.

The semiconductor substrate used in the first through eighth embodiments above may be a silicon epitaxial substrate (a substrate comprising an n⁻ drift layer grown epitaxially on a thick $n^+$ drain layer or $p^+$ collector layer). The invention of the application may also be applied in the same way to a conventional power MOSFET having an n-type drift layer with a uniform impurity concentration distribution, rather than to a super-junction MOSFET as in the first embodiment. In such a power MOSFET having a conventional drift structure, the semiconductor substrate may be a substrate comprising an n-type epitaxial layer formed on a CZ or MCZ wafer doped with a high concentration of antimony or arsenic. It is also possible to use a FZ, CZ, MCZ or other high-resistivity bulk wafer, with a high-concentration phosphorus dispersion layer formed by dispersion on one principal surface. Using either kind of semiconductor substrate (wafer), the semiconductor device can be manufactured starting with the surface structure forming step S1 described in any of FIGS. 18 to 23 above using this semiconductor substrate.

Rather than a bulk wafer, a substrate obtained by forming an n-type epitaxial layer on a CZ or MCZ wafer doped with a high concentration of antimony or arsenic may be used as the semiconductor substrate in the IGBT of the seventh embodiment or the diode of the eighth embodiment. In this case, the semiconductor device can be manufactured starting with the surface structure-forming step S1 described in any of FIGS. 18 to 23 above.

The present invention is not limited to power MOSFETs, IGBTs, p-i-n diodes and the like but is also applicable to all semiconductor device manufacturing methods used to improve bipolar operating characteristics.

Thus, a semiconductor device manufacturing method and device produced by the method have been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

What is claimed is:

1. A method of manufacturing a semiconductor device by implementing electron beam irradiation from principal surfaces of a wafer stack formed of two or more stacked semiconductor substrates, the method comprising:
   a first irradiation step of implementing electron beam irradiation from one principal surface of the wafer stack; and
   a second irradiation step of implementing electron beam irradiation from the other principal surface of the wafer stack.

2. The method of manufacturing a semiconductor device according to claim 1, wherein an irradiation dose in the second irradiation step is the same as an irradiation dose in the first irradiation step.

3. The method of manufacturing a semiconductor device according to claim 1, wherein the number of irradiations in the first irradiation step is the same as the number of irradiations in the second irradiation step.

4. The method of manufacturing a semiconductor device according to claim 1, wherein the irradiation dose in the second irradiation step is different from the irradiation dose in the first irradiation step.

5. The method of manufacturing a semiconductor device according to claim 4, wherein the irradiation dose in one of the first and second irradiation steps is 1% to less than 100% of the irradiation dose in the other one of the first and second irradiation steps.

6. The method of manufacturing a semiconductor device according to claim 1, wherein a pair of steps comprising the first irradiation step and the second irradiation steps is repeated multiple times.

7. The method of manufacturing a semiconductor device according to claim 1, wherein adjacent semiconductor devices in the wafer stack are stacked such that the first principal surfaces face each other or such that the second principal surfaces face each other.

8. The method of manufacturing a semiconductor device according to claim 1, wherein a combined thickness of the semiconductor substrates in the wafer stack is less than a range of the electron beam relative to the semiconductor substrates.

9. The method of manufacturing a semiconductor device according to claim 8, wherein the combined thickness of the semiconductor substrates in the wafer stack is less than half the range of the electron beam relative to the semiconductor substrates.

10. The method of manufacturing a semiconductor device according to claim 1, wherein an acceleration energy in the first irradiation step is such that the concentration distribution of crystal defects introduced into the two or more semiconductor substrates in the first irradiation step increases from the one principal surface of the wafer stack to the other principal surface of the wafer stack.

11. A method of manufacturing a semiconductor device according to claim 1, further comprising:
    a data acquisition step in which an irradiation dose monitor is first exposed to an electron beam and dose data on irradiation from the one principal surface to the other principal surface of the wafer stack is obtained with respect to the multiple semiconductors; and
    a calculation step in which the necessary irradiation dose of the electron beam and number of irradiations at the same acceleration energy as that used in exposing the irradiation dose monitor is calculated from the irradiation dose data acquired in the data acquisition step, wherein
    the first irradiation step and second irradiation step are performed in accordance with the necessary irradiation dose and number of irradiations.

12. The method of manufacturing a semiconductor device according to claim 11, wherein defining as x an irradiation dose of the semiconductor substrate, of the semiconductor substrates in the wafer stack, that is closest to the source of the electron beam in the data acquisition step, and defining as y an irradiation dose of the semiconductor substrate, of the semiconductor substrates in the wafer stack, that is furthest from the electron beam source producing the electron beam, and moreover defining as D the minimum necessary irradiation dose of the semiconductor substrates in the calculation step, the combined number of electron beam irradiations in the first irradiation step and second irradiation step is 2D/(x+y).

13. The method of manufacturing a semiconductor device according to claim 1, further comprising a step of heat treatment following electron beam irradiation in which heat treatment is performed after the second irradiation step.

14. The method of manufacturing a semiconductor device according to claim 13, wherein hydrogen is included in the atmosphere for the step of heat treatment following electron beam irradiation.

15. The method of manufacturing a semiconductor device according to claim 13, further comprising a step of forming a surface electrode before the step of heat treatment following electron beam irradiation.

16. The method of manufacturing a semiconductor device according to claim 13, further comprising a step of forming a surface electrode after the step of heat treatment following electron beam irradiation.

17. The method of manufacturing a semiconductor device according to claim 15, wherein the surface electrode contains a barrier metal.

18. A semiconductor device manufactured by the manufacturing method according to claim 1.

19. The method of manufacturing a semiconductor device according to claim 2, wherein the number of irradiations in the first irradiation step is the same as the number of irradiations in the second irradiation step.

20. The method of manufacturing a semiconductor device according to claim 16, wherein the surface electrode contains a barrier metal.

21. The method of manufacturing a semiconductor device according to claim 1, wherein the second irradiation step uses a different acceleration energy than the first irradiation step.

22. The method of manufacturing a semiconductor device according to claim 1, additionally comprising forming a protective layer on the semiconductor device.

23. The method of manufacturing a semiconductor device according to claim 22, wherein the protective layer is formed before the first and second electron beam irradiation.

24. The method of manufacturing a semiconductor device according to claim 22, wherein the protective layer is formed after the first electron beam irradiation and before the second electron beam irradiation.

25. The method of manufacturing a semiconductor device according to claim 22, wherein the protective layer is formed after the second electron beam irradiation.

26. The method of manufacturing a semiconductor device according to claim 1, additionally comprising thinning the wafer stack after the second electron beam irradiation.

27. The method of manufacturing a semiconductor device according to claim 1, additionally comprising thinning the wafer stack before the first electron beam irradiation.

28. The method of manufacturing a semiconductor device according to claim 1, additionally comprising forming a field stop layer after the first and second electron beam irradiation.

* * * * *